(12) United States Patent
Tsuda et al.

(10) Patent No.: US 6,984,841 B2
(45) Date of Patent: Jan. 10, 2006

(4) NITRIDE SEMICONDUCTOR LIGHT EMITTING ELEMENT AND PRODUCTION THEREOF

(75) Inventors: Yuhzoh Tsuda, Tenri (JP); Daisuke Hanaoka, Soraku-gun (JP); Takayuki Yuasa, Ikoma-gun (JP); Shigetoshi Ito, Ikoma (JP); Mototaka Taneya, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 160 days.

(21) Appl. No.: 10/468,061

(22) PCT Filed: Jan. 30, 2002

(86) PCT No.: PCT/JP02/00734

§ 371 (c)(1),
(2), (4) Date: Aug. 14, 2003

(87) PCT Pub. No.: WO02/065556

PCT Pub. Date: Aug. 22, 2002

(65) Prior Publication Data

US 2004/0041156 A1    Mar. 4, 2004

(30) Foreign Application Priority Data

Feb. 15, 2001 (JP) .............................. 2001-038228
Feb. 15, 2001 (JP) .............................. 2001-038282

(51) Int. Cl.
*H01L 29/06* (2006.01)
*H01L 31/072* (2006.01)
*H01L 31/109* (2006.01)
*H01L 31/0328* (2006.01)
*H01L 31/0336* (2006.01)

(52) U.S. Cl. ........................ 257/12; 257/13; 257/14; 257/15; 257/94; 257/95; 257/99; 257/190; 438/22; 438/29; 438/46; 438/47

(58) Field of Classification Search ............ 257/12–15
See application file for complete search history.

(56) References Cited

U.S. PATENT DOCUMENTS 5,814,839 A    9/1998    Hosoba (Continued)

FOREIGN PATENT DOCUMENTS

JP    09-036473    2/1997

(Continued)

OTHER PUBLICATIONS

Asano, T. et al., (2000) "AlGaIn Laser Diodes Grown on a ELO-GaN Substrate vs. on a Sapphire Substrate," Semiconductor Laser Conference, 2000. Conference Digest. 2000 IEEE 17th International, 2000, pp. 109 to 110.

(Continued)

*Primary Examiner*—Jerome Jackson
*Assistant Examiner*—Jesse Fenty
(74) *Attorney, Agent, or Firm*—Morrison & Foerster LLP

(57) ABSTRACT

The nitride semiconductor light emitting device includes a nitride semiconductor underlayer (102) grown on a surface of a nitride semiconductor substrate or a surface of a nitride semiconductor substrate layer laminated over a base substrate of other than a nitride semiconductor, and a light emitting device structure having a light emitting layer (106) including a quantum well layer or a quantum well layer and a barrier layer in contact with the quantum well layer between an n type layer (103–105) and a p type layer (107–110) over the nitride semiconductor underlayer. It includes a depression (D) not flattened on a surface of the light emitting device structure even after growth of the light emitting device structure.

31 Claims, 18 Drawing Sheets

U.S. PATENT DOCUMENTS

| | | | |
|---|---|---|---|
| 6,312,967 B1 * | 11/2001 | Ikeda | 438/22 |
| 6,498,048 B2 * | 12/2002 | Morita | 438/22 |
| 6,821,804 B2 * | 11/2004 | Thibeault et al. | 438/29 |
| 2001/0050376 A1 * | 12/2001 | Shibata et al. | 257/190 |
| 2002/0137249 A1 * | 9/2002 | Ishida et al. | 438/47 |

FOREIGN PATENT DOCUMENTS

| | | |
|---|---|---|
| JP | 09307193 A | 11/1997 |
| JP | 10173294 A | 6/1998 |
| JP | 11312840 A | 11/1999 |
| JP | 2000082867 A | 3/2000 |
| JP | 2000-124500 | 4/2000 |
| JP | 2000277437 A | 10/2000 |
| JP | 2000286506 A | 10/2000 |
| JP | 2001148544 A | 5/2001 |
| JP | 2001148545 A | 5/2001 |
| JP | 2001267691 A | 9/2001 |
| JP | 2002009399 A | 1/2002 |
| WO | WO00/04615 | 1/2000 |

OTHER PUBLICATIONS

Nagahama, Shin-ichi, et al., (2000) "High-Power and Long-Lifetime InGaN Multi-Quantum-Well Laser Diodes Grown on Low-Dislocation-Density GaN Substrates," *Jpn, J. Appl. Phys.* vol. 39:L647-L650.

Nakamura, Shuji, (1998) "Materials Issues for InGaN-Based Lasers," Journal of Electronic Materials, vol. 27, No. 4:160-165.

* cited by examiner

NITRIDE SEMICONDUCTOR LIGHT EMITTING ELEMENT AND PRODUCTION THEREOF

TECHNICAL FIELD

The present invention mainly relates to a nitride semiconductor light emitting device including less cracks and having a long operating lifetime at high output, and to improvement in fabricating method thereof.

BACKGROUND ART

Japanese Patent Laying-Open No. 2000-124500 discloses a way of improving a light emitting characteristic of a nitride semiconductor light emitting device, wherein grooves are formed in a GaN layer stacked on a sapphire substrate, the grooves are covered flatly again with a GaN film, and a semiconductor laser device is formed on the covering layer.

Journal of Electronic Materials, Vol. 27, No. 4, 1998, pp. 160–165 describes a way of improving a lasing lifetime of a semiconductor laser device, wherein $SiO_2$ stripe masks as growth inhibiting films are formed on a GaN substrate layer stacked on a sapphire base substrate, a nitride semiconductor underlayer is grown using a selective growth technique, and a semiconductor laser device is formed in a region above the $SiO_2$ mask.

Further, Japanese Journal of Applied Physics, Vol. 39, 2000, pp. L647–L650 describes a way of improving a lasing lifetime of a nitride semiconductor laser device at high output, wherein a nitride semiconductor underlayer is grown by a selective growth technique using $SiO_2$ masks as growth inhibiting films formed in stripe shapes on a GaN substrate, and a semiconductor laser device is formed in a region above the $SiO_2$ mask.

With the nitride semiconductor light emitting devices fabricated as described above, however, it is still desired to further improve the operating lifetime at high output and also improve the product yield thereof. In view of the foregoing, main objects of the present invention are to further improve the operating lifetime at high output of the nitride semiconductor light emitting devices and to improve the product yield thereof by suppressing occurrence of cracks in the devices.

DISCLOSURE OF THE INVENTION

According to an aspect of the present invention, a nitride semiconductor light emitting device includes a nitride semiconductor underlayer that is grown on a surface of a nitride semiconductor substrate or a surface of a nitride semiconductor substrate layer grown on a base substrate of other than a nitride semiconductor, and a light emitting device structure having a light emitting layer including a quantum well layer or a quantum well layer and a barrier layer in contact with the quantum well layer between an n type layer and a p type layer over the underlayer. There is a depression not flattened on a surface of the light emitting device structure even after the growth of the structure.

According to another aspect of the present invention, a nitride semiconductor light emitting device includes a processed substrate including a concave portion and a convex portion formed on a surface of a nitride semiconductor substrate or a surface of a nitride semiconductor layer grown on a base substrate of other than a nitride semiconductor, a nitride semiconductor underlayer grown on the uneven surface of the processed substrate, and a light emitting device structure having a light emitting layer including a quantum well layer or a quantum well layer and a barrier layer in contact with the quantum well layer between an n type layer and a p type layer over the underlayer. There is a depression not flattened above at least one of the concave and convex portions even after the growth of the nitride semiconductor underlayer and the light emitting device structure. Preferably, the processed substrate is entirely formed of a nitride semiconductor.

Preferably, the concave portion of the processed substrate is a groove of a stripe shape, and the convex portion is a hill of a stripe shape. Further, the uneven surface of the processed substrate is preferably formed of a nitride semiconductor, and longitudinal directions of the groove and hill are substantially parallel to a <1-100> direction or a <11-20> direction of the nitride semiconductor crystal.

Preferably, the depression does not exist above the width center of the groove, and a light emitting portion of the light emitting device structure is formed above a region more than 1 μm away from the width center of the groove in the width direction and within the width of the groove. In this case, the groove width is preferably in a range of 4–30 μm, and the groove depth is preferably in a range of 1–9 μm.

Preferably, the depression does not exist above the width center of the hill, and a substantial light emitting portion of the multilayered light emitting structure is formed above a region more than 1 μm away from the width center of the hill in the width direction and within the width of the hill. In this case, the hill width is preferably in a range of 4–30 μm.

Preferably, the depression is formed above the groove, and a substantial light emitting portion of the multilayered light emitting structure is formed above a region more than 2 μm away in the width direction of the groove from the nearest side edge of the depression and within the width of the groove. In this case, the groove width is preferably in a range of 7–10 μm, and the groove depth is preferably more than 1 μm. Preferably, there is a remaining thickness of more than 100 μm between the bottom of the groove and the back side of the substrate.

Preferably, the depression is formed above the hill, and a substantial light emitting portion of the multilayered light emitting structure is formed above a region more than 2 μm away in the width direction of the hill from the nearest side edge of the depression and within the width of the hill. In this case, the hill width is preferably in a range of 7–100 μm.

According to yet another aspect of the present invention, a nitride semiconductor light emitting device includes a mask substrate having a growth inhibiting film for suppressing growth of a nitride semiconductor thereon formed in a portion on a surface of a nitride semiconductor substrate or a surface of a nitride semiconductor substrate layer grown on a base substrate of other than a nitride semiconductor, a nitride semiconductor underlayer grown on the mask substrate, and a light emitting device structure having a light emitting layer including a quantum well layer or a quantum well layer and a barrier layer in contact with the quantum well layer between an n type layer and a p type layer over the nitride semiconductor underlayer. There is a depression not flattened above the growth inhibiting film even after the growth of the light emitting device structure.

The growth inhibiting film is preferably formed in a stripe pattern. Preferably, the longitudinal direction of the stripe growth inhibiting film is substantially parallel to a <1-100> direction or a <11-20> direction of a nitride semiconductor crystal included in the mask substrate.

Preferably, the depression is formed above the stripe growth inhibiting film, and a light emitting portion of the light emitting device structure is formed above a region more than 2 μm away in the width direction of the growth inhibiting film from the nearest side edge of the depression and within the width of the growth inhibiting film. The depression above the growth inhibiting film may be formed reaching the growth inhibiting film.

Preferably, the growth inhibiting film has a width in a range of 7–100 μm, and a thickness in a range of 0.05–10 μm.

Preferably, the growth inhibiting film includes at least one dielectric film of $SiO_2$, SiO, $SiN_x$ and $SiON_x$, or at least one metal of W and Mo.

In the nitride semiconductor light emitting device of any aspect of the present invention, the nitride semiconductor underlayer preferably contains at least one of Al and In.

Preferably, the nitride semiconductor underlayer is formed of GaN, and the GaN includes at least one kind of impurity selected from an impurity group consisting of Si, O, Cl, S, C, Ge, Zn, Cd, Mg and Be at a dose of more than $1 \times 10^{17}/cm^3$ and less than $5 \times 10^{18}/cm^3$.

The nitride semiconductor underlayer may be formed of $Al_xGa_{1-x}N$ ($0.01 \leq x \leq 0.15$), and the $Al_xGa_{1-x}N$ may contain at least one kind of impurity selected from an impurity group consisting of Si, O, Cl, S, C, Ge, Zn, Cd, Mg and Be at a dose of more than $3 \times 10^{17}/cm^3$ and less than $5 \times 10^{18}/cm^3$.

The nitride semiconductor underlayer may also be formed of $In_xGa_{1-x}N$ ($0.01 \leq x \leq 0.15$), and the $In_xGa_{1-x}N$ may contain at least one kind of impurity selected from an impurity group consisting of Si, O, Cl, S, C, Ge, Zn, Cd, Mg and Be in a dose of more than $1 \times 10^{17}/cm^3$ and less than $4 \times 10^{18}/cm^3$.

An electrode is preferably formed on an area including at least two depressions. Similarly, a dielectric film is preferably formed on an area including at least two depressions. At least one depression is preferably included in a bonding area where a wire is to be bonded to the nitride semiconductor light emitting device.

The quantum well layer preferably contains at least one kind of element of As, P and Sb.

The nitride semiconductor light emitting device may be one of a laser device and a light emitting diode device. Such a nitride semiconductor light emitting device can be employed as a component of any of various optical apparatuses and semiconductor light emitting apparatuses.

According to a further aspect of the present invention, a method of fabricating a nitride semiconductor light emitting device includes the step of preparing a processed substrate including a convex portion and a concave portion formed on a surface of a nitride semiconductor substrate or a surface of a nitride semiconductor layer grown on a substrate of other than a nitride semiconductor, the step of growing a nitride semiconductor underlayer over the uneven surface of the processed substrate, and the step of growing a light emitting device structure having a light emitting layer including a quantum well layer or a quantum well layer and a barrier layer in contact with the quantum well layer between an n type layer and a p type layer over the nitride semiconductor underlayer. A depression not flattened is formed above at least one of the convex and concave portions even after the growth of the underlayer and the light emitting device structure.

According to a still further aspect of the present invention, a method of fabricating a nitride semiconductor light emitting device includes the step of preparing a mask substrate by forming a growth inhibiting film for suppressing growth of a nitride semiconductor thereon in a portion on a surface of a nitride semiconductor substrate or a surface of a nitride semiconductor substrate layer grown on a based substrate of other than a nitride semiconductor, the step of growing a nitride semiconductor underlayer on the mask substrate, and the step of growing a light emitting device structure having a light emitting layer including a quantum well layer or a quantum well layer and a barrier layer in contact with the quantum well layer between an n type layer and a p type layer over the nitride semiconductor underlayer. A surface of the light emitting device structure includes a depression formed above the growth inhibiting film and not flattened even after the growth of the light emitting device structure.

Figure 1:
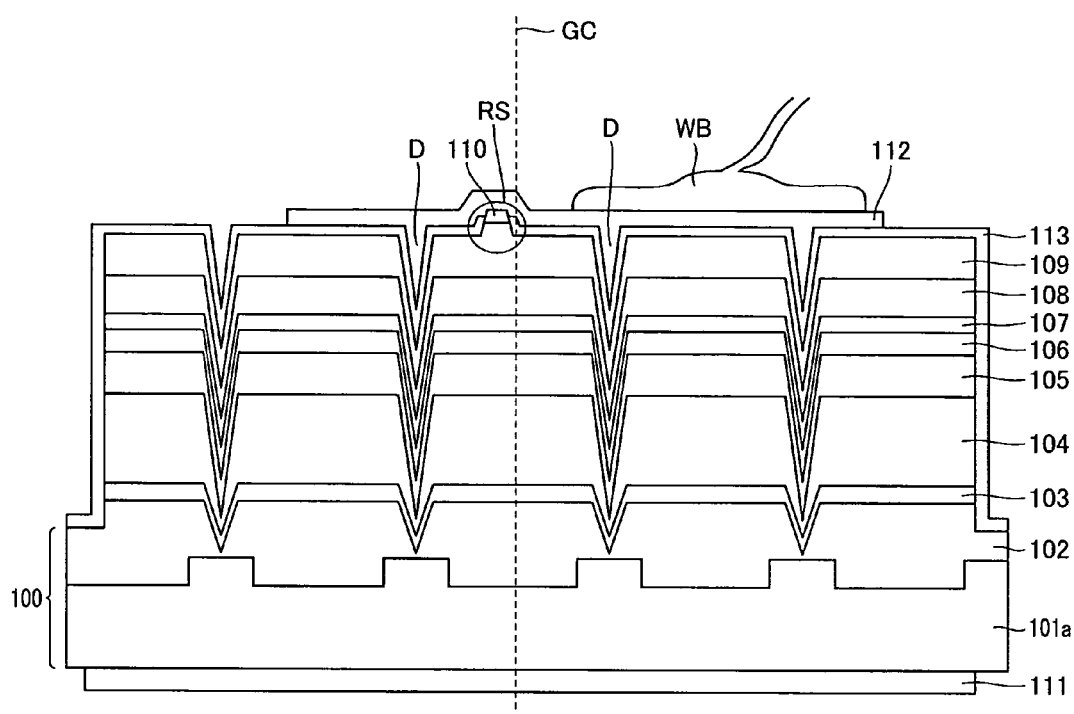
FIG. 1 is a schematic cross sectional view showing an example of a nitride semiconductor laser device formed on a depressed substrate according to the present invention.

In the drawings of the present application, the same or corresponding portions are denoted by the same reference characters. In the drawings of the present application, the dimensional relationships in length, width, thickness and others are arbitrarily changed for the purposes of clarification and simplification of the drawings, rather than showing the actual dimensional relationships.

BEST MODES FOR CARRYING OUT THE INVENTION

Hereinafter, several terms are defined before description of various embodiments of the present invention.

Figure 2A:
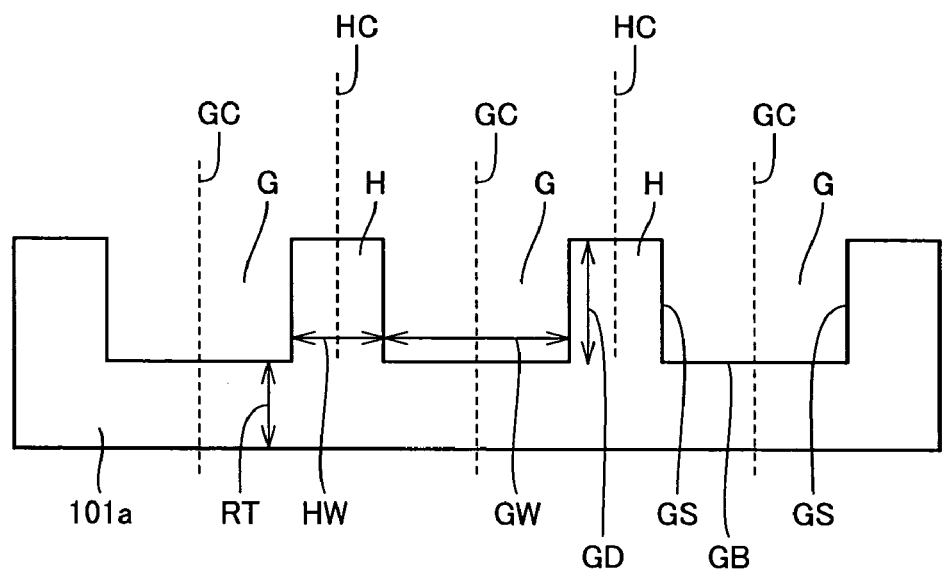
FIG. 2A is a schematic cross sectional view showing an example of a processed substrate of a nitride semiconductor usable in the present invention.
Figure 2B:
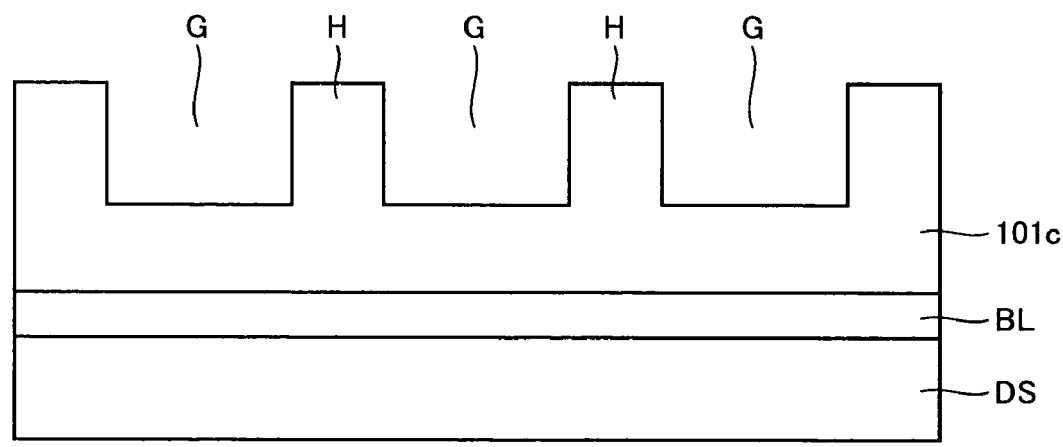
FIG. 2B is a cross sectional view showing a processed substrate including a non-nitride substrate.

Firstly, a "groove" refers to a concave portion processed in a stripe shape on a surface of a processed substrate as shown, e.g., in FIGS. 2A and 2B. Similarly, a "hill" refers to a convex portion processed in a stripe shape. The groove and hill do not necessarily have rectangular cross sections as shown in FIGS. 2A and 2B. They may have any other shapes that cause steps between concave and convex portions. Although grooves (G) and hills (H) shown in FIGS. 2A and 2B are arranged in stripes extending in one direction, they may have a grid arrangement with grooves or hills crossing each other (see FIGS. 5A–5C).

Figure 14A:
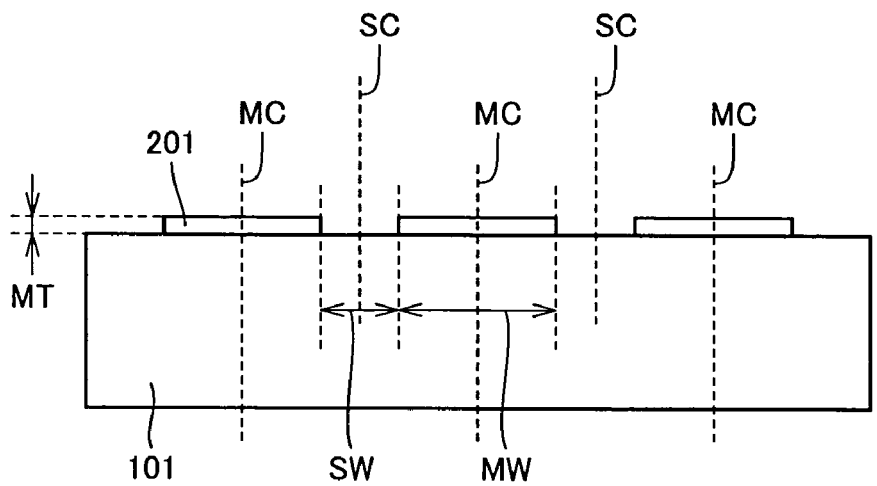
FIG. 14A is a schematic cross sectional view showing an example of a mask substrate including a nitride semiconductor substrate.

A "growth inhibiting film" refers to a film on which a nitride semiconductor is hard to grow, which is, e.g., a film 201 formed in a stripe shape on a surface of a substrate 101 as shown in FIG. 14A. In other words, a nitride semiconductor grows slowly on the growth inhibiting film, or it cannot grow directly thereon. The growth inhibiting film can be formed of an oxide or nitride of Si or a compound thereof, such as $SiO_2$, SiO, $SiN_x$ or $SiON_x$, or a metal of W, Mo or the like. Although growth inhibiting film 201 in FIG. 14A has a stripe arrangement in one direction, the stripes may extend in different directions and cross each other to have a grid arrangement, similarly to grooves G shown in FIGS. 5A–5C.

A "nitride semiconductor substrate" refers to a substrate including $Al_xGa_yIn_zN$ ($0 \leq x \leq 1$; $0 \leq y \leq 1$; $0 \leq z \leq 1$; x+y+z=1). Less than about 10% of the nitrogen element included in the nitride semiconductor substrate may be substituted with at least one of As, P and Sb (provided that the hexagonal crystal system of the substrate is maintained). Further, the nitride semiconductor substrate may be doped with any of Si, O, Cl, S, C, Ge, Zn, Cd, Mg or Be. As a plane orientation of a main surface of the nitride semiconductor substrate, a C plane {0001}, an A plane {11-20}, an R plane {1-102}, an M plane {1-100} or a {1-101} plane may be used preferably. A main surface of the substrate having an off-angle of less than 2° from any of these plane orientations can have good surface morphology.

A "non-nitride substrate" or a "base substrate" refers to a substrate of other than a nitride semiconductor. Specifically, a sapphire substrate, a SiC substrate, a Si substrate or a GaAs substrate may be used as the non-nitride substrate or the base substrate.

A "nitride semiconductor substrate layer" refers to a nitride semiconductor layer grown on a non-nitride substrate or a base substrate, which includes $Al_xGa_yIn_zN$ ($0 \leq x \leq 1$; $0 \leq y \leq 1$; $0 \leq z \leq 1$; x+y+z=1). It may be doped with at least one impurity selected from an impurity group of Si, O, Cl, S, C, Ge, Zn, Cd, Mg and Be.

A "processed substrate" refers to a nitride semiconductor substrate, or a nitride semiconductor layer grown on a non-nitride substrate, which has grooves and hills formed on its surface. The grooves and hills may be arranged periodically, or they may have varied widths. Further, the grooves may have the same depth or varied depths.

A "mask substrate" refers to a nitride semiconductor substrate, or a nitride semiconductor substrate layer grown on a base substrate, which has a grown inhibiting film partially formed on its surface. The width of the growth inhibiting film and the width of a portion unprovided with the growth inhibiting film may be periodic, or they may have varied widths. Further, the growth inhibiting films may always have the same thickness, or they may have varied thicknesses.

A "nitride semiconductor underlayer" refers to a layer grown over an uneven surface of a processed substrate or over a mask substrate, which includes $Al_xGa_yIn_zN$ ($0 \leq x \leq 1$; $0 \leq y \leq 1$; $0 \leq z \leq 1$; x+y+z=1). The underlayer may be doped with at least one impurity selected from the impurity group of Si, O, Cl, S, C, Ge, Zn, Cd, Mg and Be.

A "covering film thickness" refers to a film thickness, when a nitride semiconductor underlayer is grown over a processed substrate, from the bottom of a groove of the processed substrate to a surface of the nitride semiconductor underlayer excluding a depressed portion, or a film thickness of a nitride semiconductor underlayer on a mask substrate in a region unprovided with a growth inhibiting film.

A "light emitting layer" refers to a layer which includes at least one quantum well layer or a plurality of barrier layers stacked alternately with the quantum well layers and which can emit light. The light emitting layer of a single quantum well structure is formed of only a single well layer or formed of stacked layers of barrier layer/well layer/barrier layer.

A "light emitting device structure" refers to a structure which includes, in addition to a light emitting layer, an n type layer and a p type layer sandwiching the light emitting layer.

A "nitride semiconductor multilayered structure" refers to a structure including a nitride semiconductor underlayer and a light emitting device structure.

Figure 3:
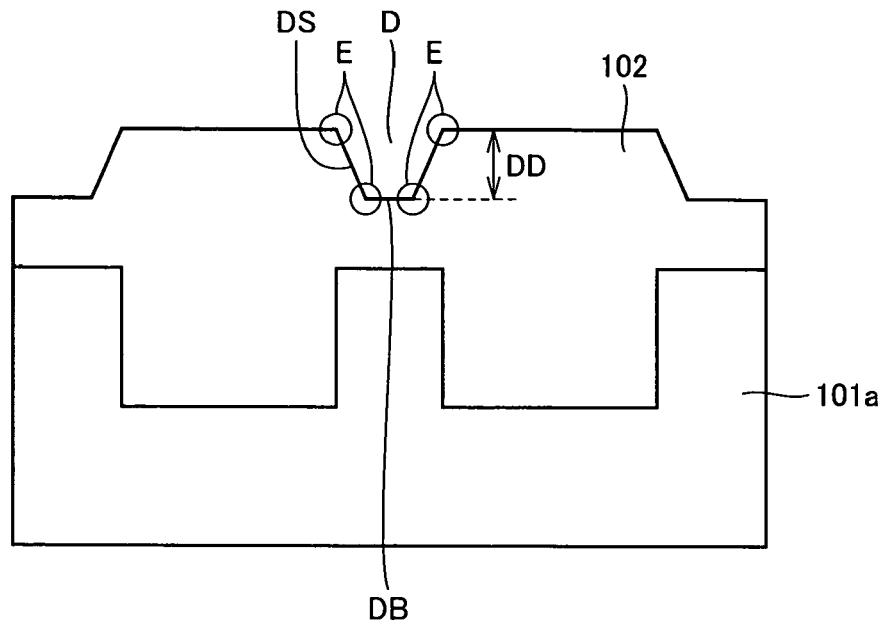
FIG. 3 is a schematic cross sectional view showing an example of a depressed substrate usable in the present invention.
Figure 15:
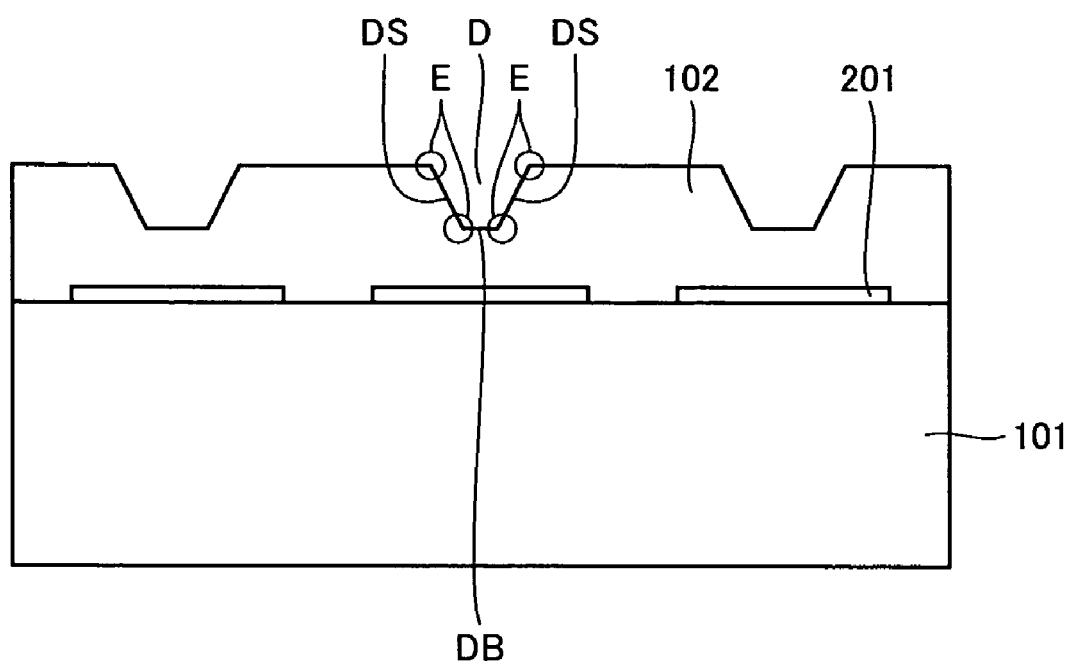
FIG. 15 is a schematic cross sectional view showing another example of the depressed substrate usable in the present invention.

A "depressed substrate" refers to an overall substrate including a processed substrate or a mask substrate covered with a nitride semiconductor underlayer having depressions thereon (see FIGS. 3 and 15).

A "depression" refers to a portion where, when a nitride semiconductor underlayer or a nitride semiconductor multilayered structure is grown to cover an uneven surface of a processed substrate or a mask substrate, the nitride semiconductor underlayer or the nitride semiconductor multilayered structure is not filled flatly (see FIGS. 3 and 15 showing examples having depressions D on the surface of nitride semiconductor underlayer 102). In particular, the depression of the present invention needs to be located on the surface of the nitride semiconductor multilayered structure. The effect of the present invention would not be obtained if a depression is formed by etching or the like after the mask substrate or the processed substrate has been covered flatly with the nitride semiconductor multilayered structure. It is evident in observation of the cross section of the nitride semiconductor multilayered structure whether or not a depression has been formed by processing after crystal growth. If the depression is formed by processing after crystal growth, continuity in the lateral direction of the stacked layers within the light emitting device structure would be broken by the depression. On the contrary, if the depression is formed along with the crystal growth, the continuity in the lateral direction of the stacked layers of the light emitting device structure would not be broken by the depression but maintained along the sidewall surface of the depression.

[First Embodiment]

Figure 4A:
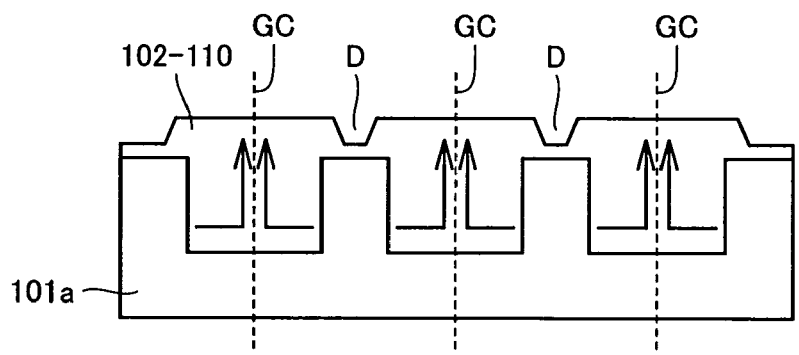
FIG. 4A is a cross sectional view illustrating a manner of crystal growth on a processed substrate of the present invention.
Figure 4B:
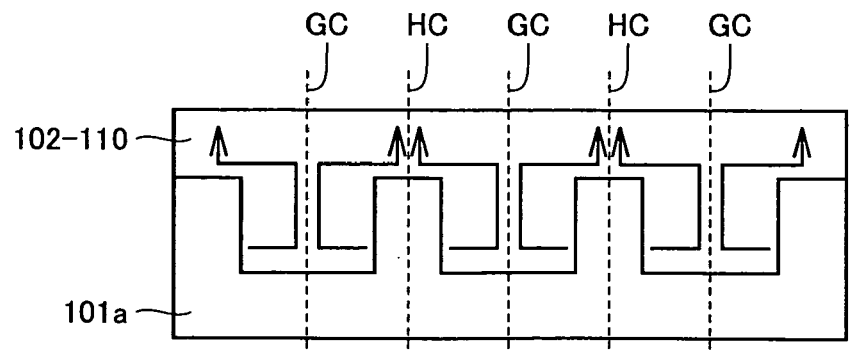
FIG. 4B is a cross sectional view illustrating a manner of crystal growth when the processed substrate is covered with a nitride semiconductor multilayered structure completely and flatly.

According to a result of investigation of the inventors, it is considered that the effect of extending a lifetime of a nitride semiconductor light emitting device obtained by the present invention is attributable to alleviation of crystal strain within a nitride semiconductor multilayered structure included in the device. FIGS. 2A and 2B are schematic cross sectional views of a processed substrate usable in the present embodiment. FIG. 2A shows a processed substrate 101a of a nitride semiconductor, a groove G, a groove center GC, a groove sidewall GS, a groove bottom GB, a groove width GW, a groove depth GD, a hill H, a hill center HC, a hill width HW, and a remaining thickness RT. FIG. 2B shows a non-nitride substrate DS, a nitride semiconductor buffer layer BL, and a nitride semiconductor substrate layer 101c. FIG. 4A illustrates a manner of crystal growth in the present embodiment, and FIG. 4B illustrates a manner of crystal growth when a conventional processed substrate is covered completely and flatly with a nitride semiconductor multilayered structure. The inventors initially examined the conventional crystal growth manner on the way to fulfillment of the present invention.

(Conventional Crystal Growth Manner)

Referring to FIG. 4B, in the case that processed substrate 101a is covered completely and flatly with a nitride semiconductor multilayered structure 102–110, crystal growth begins in a horizontal direction (hereinafter, called "lateral growth") from sidewalls of grooves formed on the processed substrate, as taught in Japanese Patent Laying-Open No. 2000-124500 for example. When such lateral growth occurs, the growing crystal is unlikely to precisely reflect the crystal lattice of the underlying substrate, so that crystal strain from beneath is alleviated. However, the crystals grown from the opposite sidewalls of each groove meet each other at groove center GC of FIG. 4B, so that crystal strain is concentrated at the groove center. The crystals having coalesced at the groove center proceed to grow in a normal crystal growth direction (perpendicular to the main surface of the substrate), and lateral growth in the direction opposite to the previous one, i.e., from groove center GC to hill center HC, is promoted to completely and flatly embed the hills. At the hill center, crystals coalesce in a similar manner as in the groove center, thereby causing concentration of crystal strain. The crystal growth then proceeds to change to the normal crystal growth direction while or after the hill center is embedded completely.

As described above, in the conventional crystal growth manner shown in FIG. 4B, crystal strain is concentrated at groove center GC and hill center HC when processed substrate 101a is covered completely and flatly with nitride semiconductor multilayered structure 102–110. Although the crystal strain from beneath is alleviated by lateral growth in a region other than the groove center and the hill center, concentration of the crystal strain at the groove center and the hill center causes residual strain to remain in the regions other than the groove center and the hill center. It is considered that the light emitting lifetime of the semiconductor light emitting device has been shortened due to the crystal strain as described above.

(Crystal Growth Manner in the Present Embodiment)

In the crystal growth manner of the present embodiment shown in FIG. 4A, lateral growth begins from sidewalls of grooves formed on processed substrate 101a, similarly as in the conventional case shown in FIG. 4B. The crystals grown from the opposite sidewalls of each groove meet each other at groove center GC of FIG. 4A, and then crystal growth proceeds in the normal growth direction. In the crystal growth manner of the present embodiment, however, crystal strain in a horizontal direction parallel to the main surface of the substrate can be alleviated via a depression D located above a hill, which depression is not filled completely with nitride semiconductor multilayered structure 102–110. In other words, the depression can alleviate such crystal strain concentrated at the groove center as in the conventional crystal growth manner shown in FIG. 4B, and then it can alleviate the crystal strain of the entire nitride semiconductor multilayered structure.

(Effect of the Present Embodiment)

As described above, according to the present embodiment, it is possible to alleviate crystal strain of the nitride semiconductor multilayered structure by leaving a depression on its surface during formation of the multilayered structure over the processed substrate.

When a nitride semiconductor laser device of the present embodiment was formed on the processed substrate (e.g., a GaN processed substrate) shown in FIG. 2A, it had a lasing lifetime of about 18000 hours. This is much longer than the lasing lifetime of about 700 hours obtained when using a conventional nitride semiconductor substrate.

On the other hand, when the nitride semiconductor laser device of the present embodiment was formed on the processed substrate utilizing a non-nitride substrate (e.g., a sapphire substrate) shown in FIG. 2B, it had a lasing lifetime of about 1000 hours. This is sufficiently longer than the lasing lifetime of about 200 hours obtained when using a conventional non-nitride substrate.

The inventors have further found that the processed substrate of the present embodiment can also suppress occurrence of cracks in the light emitting device, thereby improving the product yield of the light emitting devices.

When the nitride semiconductor laser device of the present embodiment was formed on the processed substrate of FIG. 2A, for example, crack density was 0–3 cracks/cm$^2$. When a light emitting device structure formed of nitride semiconductors was formed on a conventional GaN substrate, a large number of cracks occurred actually in the epi-wafer plane after the growth of the light emitting device structure, though it had been considered that cracks would hardly occur. This is considered to be attributable to the strain caused by the fact that the light emitting device structure is formed of a stacked structure of various layers (e.g., an AlGaN layer has a lattice constant smaller than that of a GaN layer, and an InGaN layer has a lattice constant greater than that of the GaN layer). In addition, it is considered that a currently available GaN substrate has latent residual strain in itself. In practice, when a nitride semiconductor laser device was formed on a conventional GaN substrate, crack density was about 5–8 cracks/cm$^2$. It has been found from the foregoing that utilization of the processed substrate of a nitride semiconductor of the present embodiment can decrease the crack density.

On the other hand, when the nitride semiconductor laser device of the present embodiment was formed on a processed substrate utilizing a non-nitride substrate shown in FIG. 2B, crack density was about 3–5 cracks/cm$^2$. By comparison, when a conventional nitride semiconductor laser device was formed on the processed substrate utilizing the non-nitride substrate, crack density was about 10–20 cracks/cm$^2$. It has thus been found that, even with the processed substrate including the non-nitride substrate, crack density can be reduced by utilizing the crystal growth of the present embodiment.

The effect of suppressing cracks by providing depressions described above is enhanced as the depression depth is deeper and as the depression density is higher. To achieve a deep depression, it is effective to deepen the groove, widen the groove width, or widen the hill width in forming the processed substrate. To achieve a high depression density, it is effective to narrow the groove width or hill width in forming the processed substrate. Specific numerical values of the groove width, groove depth and hill width will be explained later in detail.

Further, it has been found that the effect of suppressing cracks by depressions of the present invention has the following features. When two or more depressions are included in a single nitride semiconductor light emitting device after chip division, the rate of occurrence of cracks is decreased by about 30% compared to the device having one depression. In addition, the yield of the light emitting devices is improved particularly in the case that a ridge stripe portion RS is provided between depressions D1 and D2 as in the case of a nitride semiconductor light emitting device (laser device) having a ridge stripe structure shown in FIG. 1 for example. As a result of more detailed investigation of this case, it was found that cracks across the longitudinal direction of the ridge stripe were decreased. This is presumably because provision of depressions on both sides of the ridge stripe portion can prevent cracks from penetrating into the ridge stripe portion of the nitride semiconductor light emitting device.

Further, it has been found that the depression of the present invention has the following effect on an electrode of the nitride semiconductor light emitting device after chip division. When two or more depressions of the present invention are included in one nitride semiconductor light emitting device, the rate of defective devices due to electrode peeling is decreased by about 20% compared to the device having one depression. In addition, in the case that a ridge stripe portion RS is provided between two depressions D as in the case of the nitride semiconductor light emitting device shown in FIG. 1, for example, peeling of p electrode 112 (including the pad electrode) is prevented particularly at the ridge stripe portion, and thus the yield of the light emitting devices is improved. In view of the foregoing, it has been found that it is preferable to form an electrode on an area including two or more depressions, and it is more preferable to form the electrode on an area including depressions sandwiching the ridge stripe portion therebetween. The effect of preventing peeling regarding the electrode at the ridge stripe portion was similarly obtained also regarding a dielectric film, e.g., SiO$_2$ dielectric film 113 shown in FIG. 1. SiO$_2$ dielectric film 113 may be replaced with another dielectric film such as SiN$_x$.

Further, it has been found that the depression of the present invention has the following effect on wire bonding of a nitride semiconductor device after chip division. Inclusion of one or more depressions D of the present invention in a bonding area between wire bond WB and the nitride semiconductor light emitting device reduced peeling of the wire bond itself or peeling of an electrode including the wire bond by about 20%. It has thus been found that it is preferable that at least one depression of the present invention is included in a bonding area between the wire bond and the nitride semiconductor light emitting device.

(Processed Substrate)

The processed substrate of the present embodiment is formed utilizing a nitride semiconductor substrate or a non-nitride substrate. In particular, use of the nitride semiconductor substrate for the processed substrate is preferable in the following points. There is only a small difference in thermal expansion coefficient between the nitride semiconductor substrate and the nitride semiconductor underlayer formed thereon, so that bowing of the substrate is much smaller than in the case of using the non-nitride substrate. Thus, the grooves and hills can more precisely be formed on the nitride semiconductor substrate as compared to on the nitride semiconductor layer formed over the non-nitride substrate. Further, as will be explained in detail in the item below titled "(Position for Forming Light Emitting Portion)", such very small bowing makes it possible to form a light emitting device structure precisely avoiding a region (regions AIII and AIV described later) where a device defect such as a shortened light emitting lifetime is liable to be originated. Still further, the small bowing of the substrate in itself serves to prevent occurrence of new strain or cracks, thereby producing additional effects of extending the lifetime of the semiconductor laser device and reducing other defects in characteristics.

(Thickness of Nitride Semiconductor Underlayer Covering Processed Substrate)

In the present embodiment, it is possible, e.g., by growing nitride semiconductor underlayer 102 thinner, to form a depression D where processed substrate 101a is not covered with nitride semiconductor multilayered structure 102–110. However, except the case that it is intended to form depression also in a region above groove G, it is generally difficult to form a light emitting device in the region above the groove unless the groove formed on the processed substrate is embedded flatly. Thus, the covering film thickness of nitride semiconductor underlayer 102 is preferably more than about 2 μm and less than 20 μm. If the covering film thickness becomes thinner than 2 μm, it begins to become difficult to completely and flatly embed the groove with the nitride semiconductor underlayer, though it depends on the groove width and the groove depth formed on the processed substrate. On the other hand, if the covering film thickness becomes thicker than 20 μm, particularly in the case that the processed substrate includes a non-nitride substrate, the effects of alleviating crystal strain and suppressing cracks by provision of depressions are surpassed by stress strain due to difference in thermal expansion coefficient between the processed substrate and the nitride semiconductor underlayer (or the nitride semiconductor multilayered structure), so that the effect of the present invention may not be achieved sufficiently.

(Groove Width)

Groove G formed on the nitride semiconductor substrate can readily be embedded in nitride semiconductor underlayer 102 if the groove width GW is relatively narrow, whereas it cannot readily be embedded if groove width GW is wide. According to a result of investigation of the inventors, a groove width GW1 for completely and flatly covering the groove formed on processed substrate 101a with the nitride semiconductor underlayer is preferably more than 4 $\mu$m and less than 30 $\mu$m, and more preferably more than 4 $\mu$m and less than 25 $\mu$m. On the other hand, a groove width GW2 for leaving depression D by incompletely covering the groove of the processed substrate with the nitride semiconductor underlayer is preferably more than 7 $\mu$m and less than 75 $\mu$m, though it may be more than 7 $\mu$m and less than about 100 $\mu$m. However, it is strongly dependent on the covering film thickness of the nitride semiconductor underlayer whether or not a depression is formed above a groove of the processed substrate. For completely and flatly covering the groove or for forming a depression in a region above the groove, therefore, it is necessary to properly adjust the covering film thickness of nitride semiconductor underlayer 102 as well as groove widths GW1 and GW2.

The lower and upper limits of groove width GW1 are estimated from the following standpoints. In the case that a depression is not formed above the groove, the lower limit of groove width GW1 depends on a size of the light emitting portion within the light emitting device. The position for forming the light emitting portion of the light emitting device will be explained in more detail in the item below titled "(Position for Forming Light Emitting Portion)" with reference to FIG. 6. For example, when a nitride semiconductor laser device is formed in a region above a flatly covered groove of a depressed substrate, it is preferable from the standpoint of a lasing lifetime that the light emitting portion beneath the ridge stripe portion of the laser device belongs to a region AI in FIG. 7A. Thus, the lower limit of groove width GW1 needs to be more than twice the ridge stripe width. Since the ridge stripe is formed with a width of about 1–3 $\mu$m, it is estimated that groove width GW1 should be more than 4 $\mu$m which corresponds to a sum of the width 2 $\mu$m of the region AIII in FIG. 7A and the stripe width (1 $\mu$m)×2.

On the other hand, the reason why there is an upper limit for groove width GW1 is that if groove width GW1 exceeds 25 $\mu$m, it becomes difficult to completely embed the groove having that groove width GW1 in nitride semiconductor underlayer 102 having the covering film thickness of less than 10 $\mu$m. Similarly, when groove width GW1 exceeds 30 $\mu$m, it becomes difficult to completely embed the groove in nitride semiconductor underlayer 102 even if the underlayer is grown to the covering film thickness of more than 20 $\mu$m.

The lower and upper limits of groove width GW2 are estimated from the following standpoints. In the case that a depression is formed above the groove, the lower limit of groove width GW2 depends on the size of the light emitting portion within the light emitting device, similarly to the lower limit of groove width GW1. For example, when a nitride semiconductor laser device is formed in a region above groove G having depression D formed within groove width GW2, it is preferable from the standpoint of a lasing lifetime that the light emitting portion beneath the ridge stripe portion of the laser device belongs to a region AII in FIG. 7B. Since the ridge stripe width is about 1–3 $\mu$m and the minimal depression width is estimated to be 1 $\mu$m, the lower limit of groove width GW2 needs to be more than 7 $\mu$m which corresponds to a sum of the width of a region AIV including depression D, i.e., depression width (1 $\mu$m)+2 $\mu$m×2 (see FIG. 7), and the stripe width (1 $\mu$m)×2. However, when the nitride semiconductor laser device is formed such that any part of the ridge stripe portion is not included in a region above groove G having depression D formed, groove width GW2 only needs to be more than the depression width (1 $\mu$m), and preferably more than the width (5 $\mu$m) of region AIV including depression D. The meaning of region AIV will be explained later with reference to FIG. 6.

On the other hand, the upper limit of groove width GW2 having depression D formed above groove G is not set specifically from the standpoint of a lasing lifetime. However, too wide groove width GW2 results in reduction of the depression density per unit area of the wafer, in which case the effect of alleviating crystal strain and the effect of suppressing occurrence of cracks would decrease, and thus the number of light emitting device chips obtained per wafer would also decrease. From the above-described standpoint, the upper limit of groove width GW2 is preferably less than 100 $\mu$m, and more preferably less than 75 $\mu$m.

(Groove Depth)

When groove G formed on the nitride semiconductor substrate has a relatively shallow depth GD, it is easily embedded in the nitride semiconductor underlayer, while a deep groove is difficult to be embedded in the underlyer. Formation of depression D by adjusting groove depth GD is preferable compared to formation of depression D by adjusting groove width GW, since it does not decrease the number of light emitting device chips obtained per wafer.

According to a result of investigation of the inventors, a groove depth GD1 for completely and flatly covering the groove of the processed substrate with the nitride semiconductor underlayer is preferably more than 1 $\mu$m and less than 9 $\mu$m, and more preferably more than 2 $\mu$m and less than 6 $\mu$m. On the other hand, a groove depth GD2 for leaving depression D by incompletely covering the groove of the processed substrate with the nitride semiconductor underlayer is preferably more than 1 $\mu$m, and more preferably more than 2 $\mu$m. The upper limit of groove depth GD2 is not set specifically, and the remaining thickness RT as shown in FIG. 2A only needs to be more than 100 $\mu$m. However, it is strongly dependent on the covering film thickness of the nitride semiconductor underlayer whether or not a depression is formed above a groove of the processed substrate, so that it is necessary to properly adjust the covering film thickness of nitride semiconductor underlayer 102 as well as groove depths GD1 and GD2, for completely and flatly covering the groove or for forming a depression above the groove.

The lower and upper limits of groove depth GD1 are estimated from the following standpoints. In the case that a depression is not formed above the groove, the lower limit of groove depth GD1 is preferably more than 1 $\mu$m and more preferably more than 2 $\mu$m. If groove depth GD1 is shallower than 1 $\mu$m, growth in a direction perpendicular to the main surface of the substrate will be more dominant than lateral growth in the crystal growth manner, so that the effect of reducing crystal strain by the lateral growth may not be obtained sufficiently. The strain reducing effect by the lateral growth can be achieved sufficiently if the lower limit of groove depth GD1 is more than 2 $\mu$m.

The upper limit of groove depth GD1 is preferably less than 9 $\mu$m, and more preferably less than 6 $\mu$m. If groove depth GD1 exceeds 6 $\mu$m, it begins to become difficult to embed the grove having such a groove depth GD1 completely in the nitride semiconductor underlayer of a covering film thickness of less than 10 $\mu$m. Similarly, if groove depth GD1 exceeds 9 $\mu$m, it begins to become difficult to embed the groove completely in the nitride semiconductor underlayer even if the underlayer has a covering film thickness of more than 20 $\mu$m.

The lower and upper limits of groove depth GD2 are estimated from the following standpoints. The lower limit of groove depth GD2 for forming depression D above groove G is preferably more than 1 μm and more preferably more than 2 μm, similarly as in the case of groove depth GD1. As described above in conjunction with groove depth GD1, the characteristic (e.g., the lasing lifetime) of the light emitting device formed in a region above the groove may be degraded if the effect of reducing crystal strain by lateral growth is not obtained sufficiently. Although groove depths GD2 and GD1 have the similar lower limits, it is dependent on the covering film thickness of the nitride semiconductor underlayer whether a depression is formed with the nitride semiconductor film in a region above the groove or the depression is embedded completely. The upper limit of groove depth GD2 is not set specifically, and formation of a depression becomes easier as groove depth GD2 increases. The processed substrate, however, is liable to break if the groove becomes too deep. Thus, it is necessary to keep remaining thickness RT of more than 100 μm between the bottom of the groove and the back side of the substrate (see FIG. 2A).

(Hill Width)

Hill H formed on the processed substrate can easily be embedded in nitride semiconductor underlayer 102 when its hill width HW is relatively narrow, while it cannot easily be embedded when hill width HW is wide. According to a result of investigation of the inventors, a hill width HW1 for completely and flatly covering the hill of the processed substrate with the nitride semiconductor underlayer is preferably more than 4 μm and less than 30 μm, and more preferably more than 4 μm and less than 25 μm. A hill width HW2 for leaving depression D by incompletely covering the hill of the processed substrate with the nitride semiconductor underlayer is preferably more than 7 μm and less than 75 μm, though it may be more than 7 μm and less than 100 μm. It is strongly dependent on the covering film thickness of the nitride semiconductor underlayer whether or not a depression is formed above a hill of the processed substrate. For completely and flatly covering the hill or for forming the depression in a region above the hill, therefore, it is necessary to properly adjust the covering film thickness of the nitride semiconductor underlayer as well as hill widths HW1 and HW2.

The lower and upper limits of hill width HW1 are estimated from the following standpoints. In the case that a depression is not formed above a hill, the lower limit of hill width HW1 depends on a size of the light emitting portion within the light emitting device, similarly to the lower limit of groove width GW1 described above. For example, when a nitride semiconductor laser device is formed in a region above a flatly covered hill of a depressed substrate, it is preferable from the standpoint of a lasing lifetime that the light emitting portion beneath the ridge stripe portion of the laser device belongs to a region AI not including a depression (see FIG. 7B). The ridge stripe can be formed with a width of about 1–3 μm, and the width of a region AIII not including a depression above the hill can be estimated to be 2 μm. Thus, the lower limit of hill width HW1 needs to be more than 4 μm as a sum of the stripe width (1 μm)×2 and the 2 μm width of region AIII. The upper limit of hill width HW1 may be estimated in a similar manner as the upper limit of groove width GW1 described above.

Further, the lower and upper limits of hill width HW2 are estimated as follows. In the case that a depression is formed above a hill, the lower limit of hill width HW2 of the hill depends on a size of the light emitting portion within the light emitting device, similarly to the lower limit of groove width GW2 described above. For example, when a nitride semiconductor laser device is formed in a region including depression D above the hill having hill width HW2, it is preferable from the standpoint of a lasing lifetime that the light emitting portion beneath the ridge stripe portion of the laser device belongs to a region AII in FIG. 7A. The ridge stripe can be formed with a width of about 1–3 μm, and a minimal width of the depression can be estimated to be 1 μm. Thus, the lower limit of hill width HW2 needs to be more than 7 μm as a sum of the width of a region IV including the depression, i.e., depression width (1 μm)+2 μm×2, and the stripe width (1 μm)×2. However, in the case that a nitride semiconductor laser device is formed such that any part of the ridge stripe is not included in a region above the hill including a depression, hill width HW2 only needs to be more than the depression width (1 μm), and more preferably more than the width (5 μm) of the region AIV including the depression. On the other hand, the upper limit of width HW2 of the hill above which depression D is formed is not set specifically from the standpoint of the lasing lifetime. However, it is preferably less than 100 μm and more preferably less than 75 μm for the reasons similar as in the case of the upper limit of groove width GW2 described above.

(Longitudinal Direction of Groove)

The longitudinal direction of the groove formed on the nitride semiconductor substrate or on the nitride semiconductor substrate layer over a non-nitride substrate having a main surface of a {0001} C plane is most preferably parallel to the <1-100> direction, and next preferably parallel to the <11-20> direction. Even when the longitudinal direction of the groove made an angle of the order of within ±5° to such a specific crystal direction in the {0001} C plane, it did not cause any substantial effect.

Figure 8A:
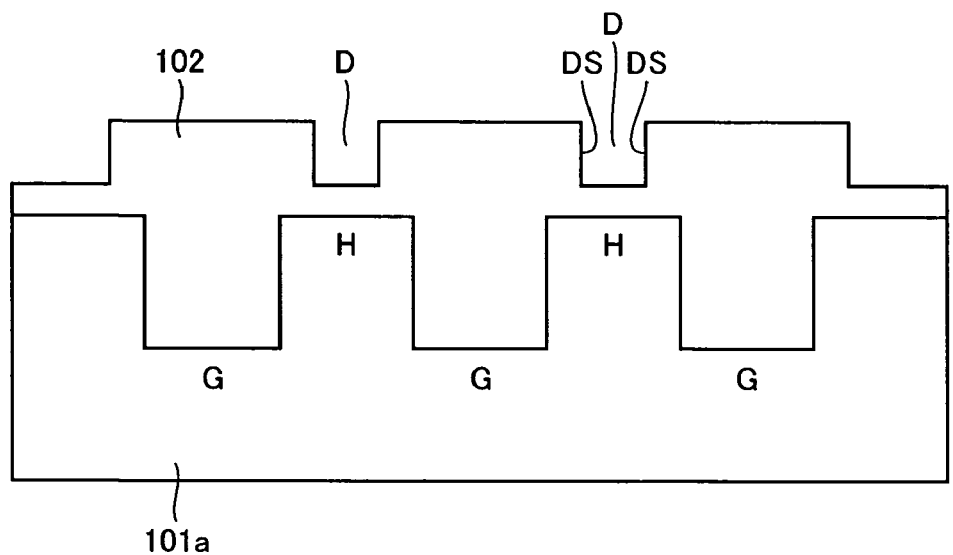
FIGS. 8A and 8B are schematic cross sectional views showing other examples of the depressed substrate usable in the present invention.

Formation of the groove in the <1-100> direction of the nitride semiconductor crystal is advantageous in that the depression is unlikely to be embedded and that the effects of suppressing crystal strain and occurrence of cracks are very high. When a nitride semiconductor underlayer grows in the groove formed in this direction, the sidewall surface of the depression tends to become primarily a {11-20} plane. The {11-20} plane is perpendicular to the main surface of the substrate as shown in FIG. 8A, so that depression D is likely to have an approximately rectangular cross section. When the cross section of the depression is close to the rectangular shape, it is hard to supply a row material of the nitride semiconductor to the bottom of the depression, hindering sufficient filling of groove G with nitride semiconductor underlayer 102. As such, depression D is unlikely to be embedded even if processed substrate 101a is covered with relatively thick nitride semiconductor underlayer 102. Further, since the depression having the rectangular shape is unlikely to be embedded, it becomes much deeper (almost maintaining the groove depth formed in the processed substrate) than the depression having a sidewall surface of a {1-101} plane as will be described below. Accordingly, crystal strain of nitride semiconductor underlayer 102 grown on the processed substrate is alleviated, and occurrence of cracks is suppressed effectively.

On the other hand, formation of the groove in the <11-20> direction of the nitride semiconductor crystal is advantageous in that the shape of the depression becomes sharp and that fluctuation in position of the depression becomes small. In the case that a nitride semiconductor underlayer is grown in the groove formed in this direction, primarily a {1-101} plane is likely to be formed on the sidewall of the depression. The {1-101} plane is extremely flat, and the edge portion (see FIG. 3) is sharp and unlikely to meander. Thus, the depression in the <11-20> direction is also unlikely to meander and thus becomes straight. Accordingly, it is possible to provide wide regions AI and AII for forming a light emitting device of a long light emitting lifetime as will be described later (leading to an increased number of light emitting devices obtained per wafer), and it is also possible to prevent the yield of the devices from being decreased due to misalignment of the formed laser devices.

Grooves G and hills H described above all have the stripe shapes, which is advantageous in the following point. A portion (beneath the ridge stripe) contributing to lasing of the nitride semiconductor laser device is in a stripe shape. Thus, if regions AI and AII preferable for forming the ridge stripe therein also have the stripe shapes, it is easy to form the portion contributing to the lasing in region AI or AII. Grooves and hills having a grid pattern are advantageous in that crystal strain can be alleviated uniformly within the substrate plane and that the effect of suppressing occurrence of cracks is high. Grooves G may be formed in a grid pattern, as shown in FIGS. 5A–5C, for example.

Figure 5A:
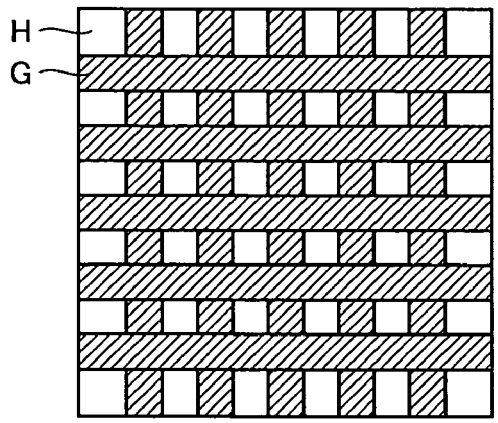
FIG. 5A is a top plan view illustrating grooves (concave portions) and hills (convex portions) formed on a processed substrate usable in the present invention in the case that the grooves are arranged in two different directions orthogonal to each other.
Figure 5B:
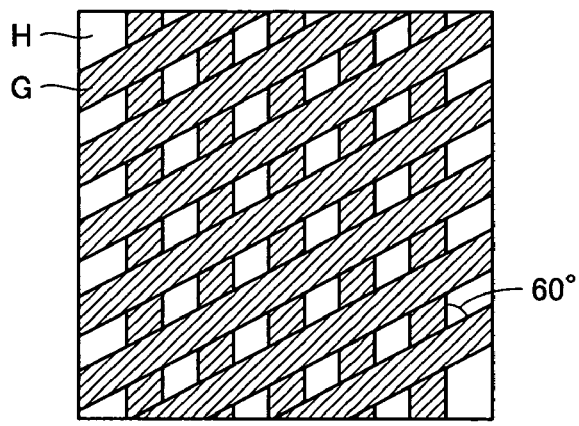
FIG. 5B is a top plan view in the case that the grooves are arranged in two different directions making 60° with each other.
Figure 5C:
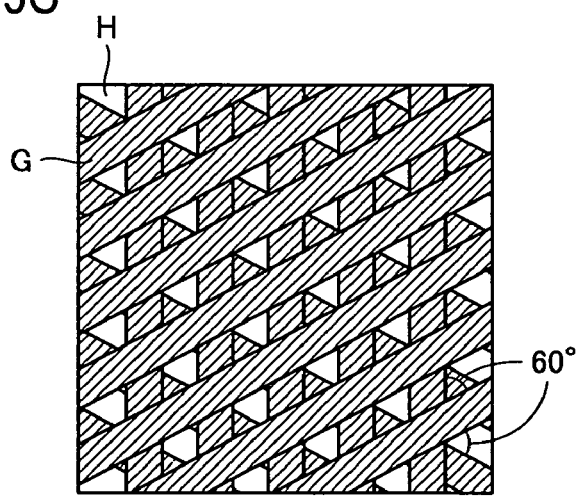
FIG. 5C is a top plan view in the case that the grooves are arranged in three different directions making 60° with each other.

FIG. 5A is a top plan view of the processed substrate having convex and concave portions in the case that grooves are arranged in two different directions orthogonal to each other. FIG. 5B is a top plan view of the processed substrate having convex and concave portions in the case that grooves are arranged in two different directions at 60° with each other. FIG. 5C is a top plan view of the processed substrate having convex and concave portions in the case that grooves are arranged in three different directions at 60° with each other.

(Nitride Semiconductor Underlayer)

A GaN film, an AlGaN film or an InGaN film may be employed as underlayer 102 of nitride semiconductor film covering the processing substrate. The nitride semiconductor underlayer may be doped with at least one impurity selected from an impurity group of Si, O, Cl, S, C, Ge, Zn, Cd, Mg and Be.

The nitride semiconductor underlayer of GaN film is preferable in the following points. Firstly, since the GaN film is a binary mixed crystal, good controllability of crystal growth can be obtained. Further, the surface migration length of the GaN film is longer than that of the AlGaN film and shorter than that of the InGaN film, so that a portion where a groove is desired to be embedded flatly is properly covered with the GaN film, while coverage by the GaN film is properly restricted at a portion where a depression is desired to be formed. The GaN film used as the nitride semiconductor underlayer preferably has an impurity concentration of more than $1 \times 10^{17}/cm^3$ and less than $5 \times 10^{18}/cm^3$. Addition of the impurity in this concentration range ensures good surface morphology of the nitride semiconductor underlayer and uniform thickness of the light emitting layer, thereby improving the characteristics of the light emitting device.

The nitride semiconductor underlayer of AlGaN film is preferable in the following points. The AlGaN film containing Al is shorter in surface migration length than the GaN and InGaN films. Such a short surface migration length means that the cross sectional shape of the depression maintains a sharp state (e.g., the edge portion in FIG. 3 does not become dull), and that the nitride semiconductor is unlikely to flow into the bottom of the depression (hindering filling of the depression). Further, since the nitride semiconductor is hard to flow into the bottom of the groove at the time of covering the groove, lateral crystal growth from the sidewalls of the groove becomes prominent, so that it becomes possible to further alleviate the crystal strain. The Al composition ratio x of the $Al_xGa_{1-x}N$ film is preferably more than 0.01 and less than 0.15, and more preferably more than 0.01 and less than 0.07. If the Al composition ratio x is smaller than 0.01, the surface migration length described above becomes rather long. If the Al composition ratio x is more than 0.15, the surface migration length becomes too short, in which case even the region where the groove is desired to be embedded flatly may not be covered sufficiently. The effect similar to that of the AlGaN film can be obtained with any nitride semiconductor underlayer containing Al. Further, the AlGaN film used as the nitride semiconductor underlayer preferably has an impurity concentration of more than $3 \times 10^{17}/cm^3$ and less than $5 \times 10^{18}/cm^3$. Addition of the impurity in this concentration range as well as Al ensures a properly short surface migration length of the nitride semiconductor underlayer, thereby further alleviating the crystal strain.

The nitride semiconductor underlayer of InGaN film is preferable in the following points. The InGaN film containing In is superior in elasticity to the GaN and AlGaN films. Thus, it is considered that the InGaN film filled in the groove of the processed substrate makes the crystal strain from the substrate distributed over the entire nitride semiconductor multilayered structure, and then alleviates the crystal strain effectively. The In composition ratio x of the $In_xGa_{1-x}N$ film is preferably more than 0.01 and less than 0.15, and more preferably more than 0.01 and less than 0.1. If the In composition ratio x is smaller than 0.01, the effect of superior elasticity because of inclusion of In may not be obtained. If the In composition ratio x is more than 0.15, the crystallinity of the InGaN film may be degraded. The effect similar to that of the InGaN film can be obtained with any nitride semiconductor underlayer containing In. Further, the InGaN film used as the nitride semiconductor underlayer preferably has an impurity concentration of more than $1 \times 10^{17}/cm^3$ and less than $4 \times 10^{18}/cm^3$. Addition of the impurity in this concentration range as well as In is advantageous in that the surface morphology of the nitride semiconductor underlayer becomes favorable and the elasticity can also be maintained.

(Position for Forming Light Emitting Portion)

As a result of detailed investigation of the inventors, it has been found that a lasing lifetime changes depending on the position over a depressed substrate where a light emitting portion (beneath the ridge stripe portion) of the nitride semiconductor laser device is formed. Here, the light emitting portion refers to a portion into which electric current is introduced within the light emitting device and which substantially contributes to light emission in the light emitting layer. In the case of a nitride semiconductor laser device having a ridge stripe structure, for example, the light emitting portion corresponds to a part of the light emitting layer beneath the ridge stripe portion into which current is introduced while being constricted.

Figure 6:
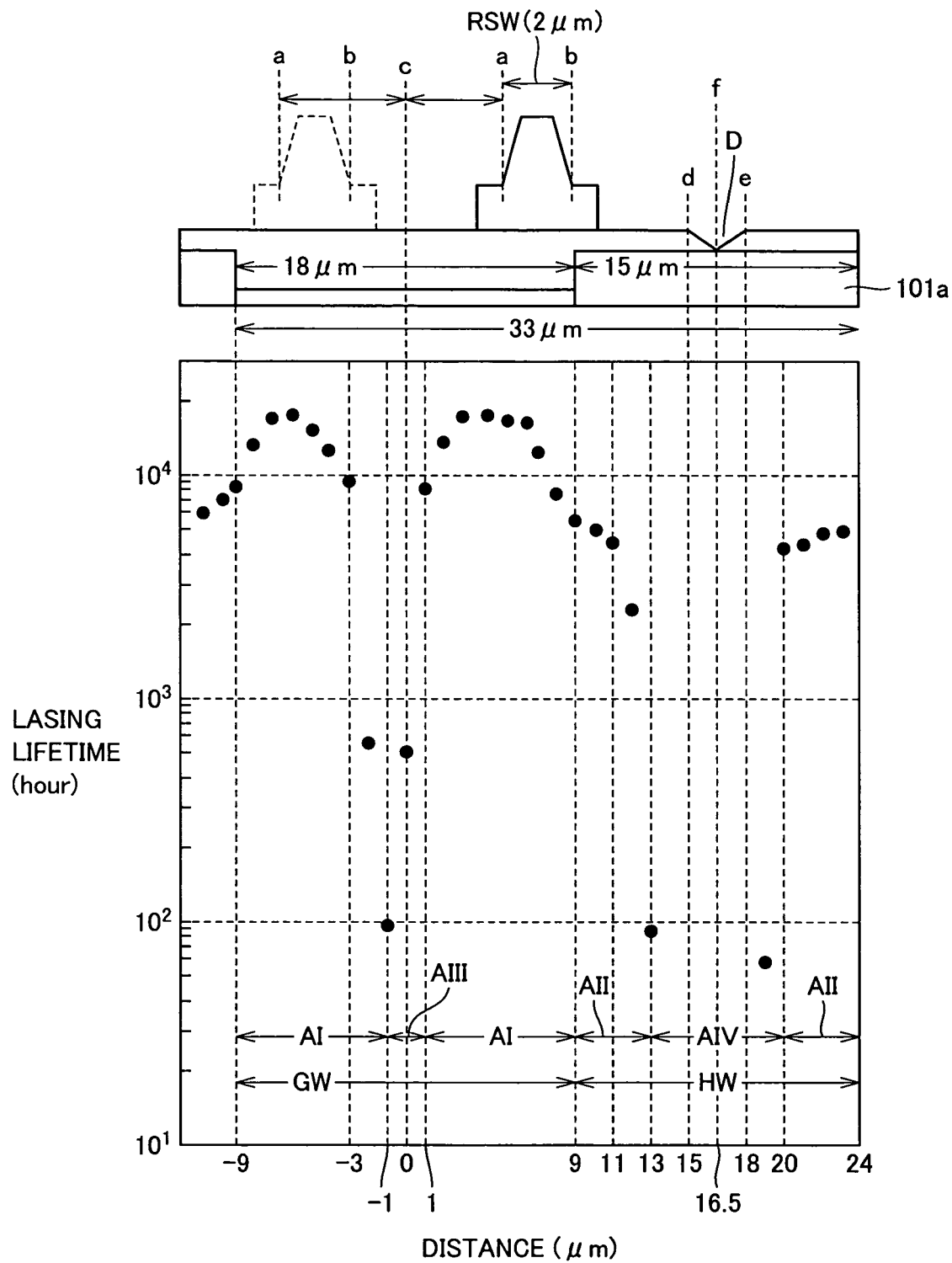
FIG. 6 shows the relation between a position of a ridge stripe portion of a nitride semiconductor laser device formed on a depressed substrate usable in the present invention and a lasing lifetime of the device.

Referring to FIG. 6, the horizontal axis of a graph represents the distance from the groove center (c) of a depressed substrate to a ridge stripe edge (a) in the width direction, and the vertical axis represents the lasing lifetime. Here, the distance from groove center (c) to ridge stripe edge (a) (hereinafter, called "c-a distance") is expressed with the positive value on the right side of groove center (c) in the width direction, and expressed with the negative value on the left side thereof. The nitride semiconductor laser device measured in FIG. 6 is structured and produced in a similar manner as in the eighth embodiment as will be described later, and a GaN processed substrate is employed. The ridge stripe width, groove width GW, hill width HW, and the width of depression D above the hill were 2 μm, 18 μm, 15 μm, and 3 μm, respectively.

As seen from FIG. 6, the lasing lifetime of the nitride semiconductor laser device having a ridge stripe portion formed above groove G tends to become longer than that of the device having its ridge stripe portion formed above hill H. More detailed investigation has revealed that even in the region above the groove, if the ridge stripe portion is formed in a region having the c-a distance of more than −3 μm and less than 1 μm, the lasing lifetime is decreased dramatically. Here, if the c-a distance of −3 μm is expressed in terms of a distance from groove center (c) to a ridge stripe edge (b) (hereinafter, called "c-b distance") taking account of the ridge stripe width RSW of 2 μm, the c-b distance becomes −1 μm. This means that the lasing lifetime is decreased remarkably when the ridge stripe portion of the nitride semiconductor laser device is formed such that at least a part thereof is included in a range of less than 1 μm on each side of groove center (c) in the width direction.

The region where the lasing lifetime is decreased dramatically (in the range of less than 1 μm on each side of groove center (c) in the width direction) is called a region AIII. Thus, it is preferable to form the ridge stripe portion of the nitride semiconductor laser device such that its entire portion (a-b width) is included in a range other than region AIII. Here, within the groove width GW range, a range of more than 1 μm away in the groove width direction from groove center (c) on its each side is called a region AI. Region AI corresponds to a region where a nitride semiconductor laser device having a long lasing lifetime can be formed most preferably over the depressed substrate, even compared to such a region AII as will be described later.

Similarly as in the region above the groove, it is also found in the region above the hill that the lasing lifetime is decreased remarkably when the light emitting portion of the nitride semiconductor laser device is formed in a region having c-a distance of more than 11 μm and less than 20 μm. Here, if the state of a 11 μm c-a distance is expressed in terms of a distance from a depression edge (d) to ridge stripe edge (b), b-d distance becomes 2 μm. Similarly, if the state of a 20 μm c-a distance is expressed in terms of a distance from a depression edge (e) to ridge stripe edge (a), e-a distance becomes 2 μm. This means that the lasing lifetime is decreased dramatically if at least a part of the light emitting portion beneath the ridge stripe portion is included within a range of less than 2 μm outside from each side edge of the depression. Such a region where the lasing lifetime is decreased dramatically is called a region AIV. Thus, it is preferable to form the ridge stripe portion such that its entire portion (a-b) is included in a range of more than 2 μm away in the hill width direction from depression edge (d) to the left or in a range of more than 2 μm away from depression edge (e) to the right, avoiding region AIV. Here, within the region above the hill, a region in a range of more than 2 μm away in the hill width direction to the left from depression edge (d) and a region in a range of more than 2 μm away from depression edge (e) to the right are each called a region AII. Although the lasing lifetime becomes shorter in region AII than in region AI described above, it is possible by utilizing region AII to form a nitride semiconductor laser device having a lifetime of a few thousand hours.

Figure 7A:
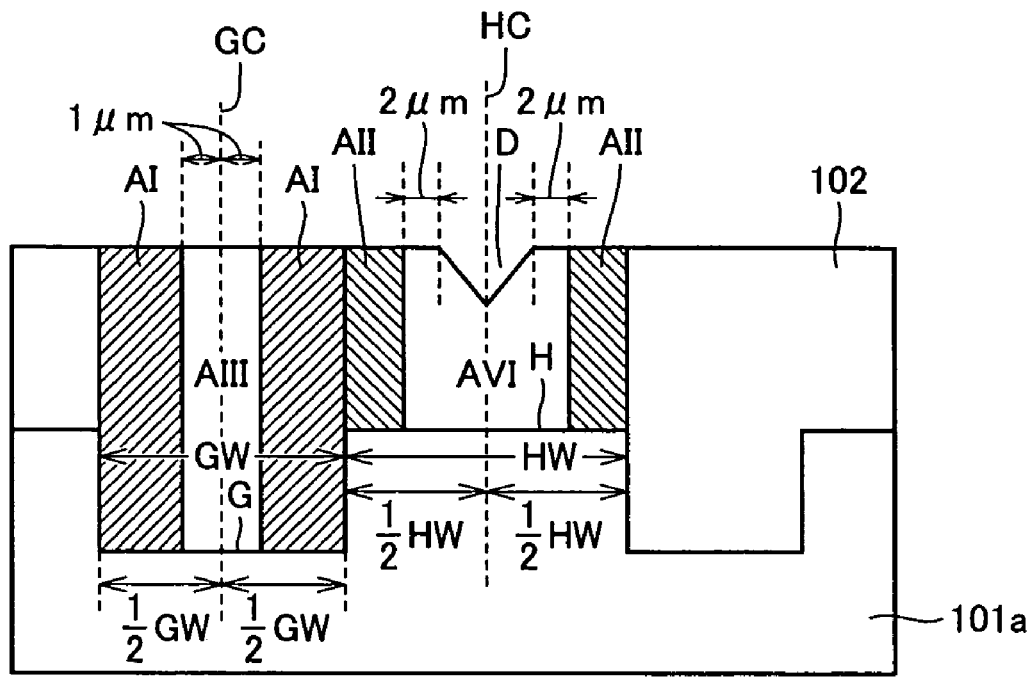
FIGS. 7A and 7B are schematic cross sectional views showing regions preferable for forming a light emitting portion of a light emitting device structure formed on a depressed substrate usable in the present invention.
Figure 7B:
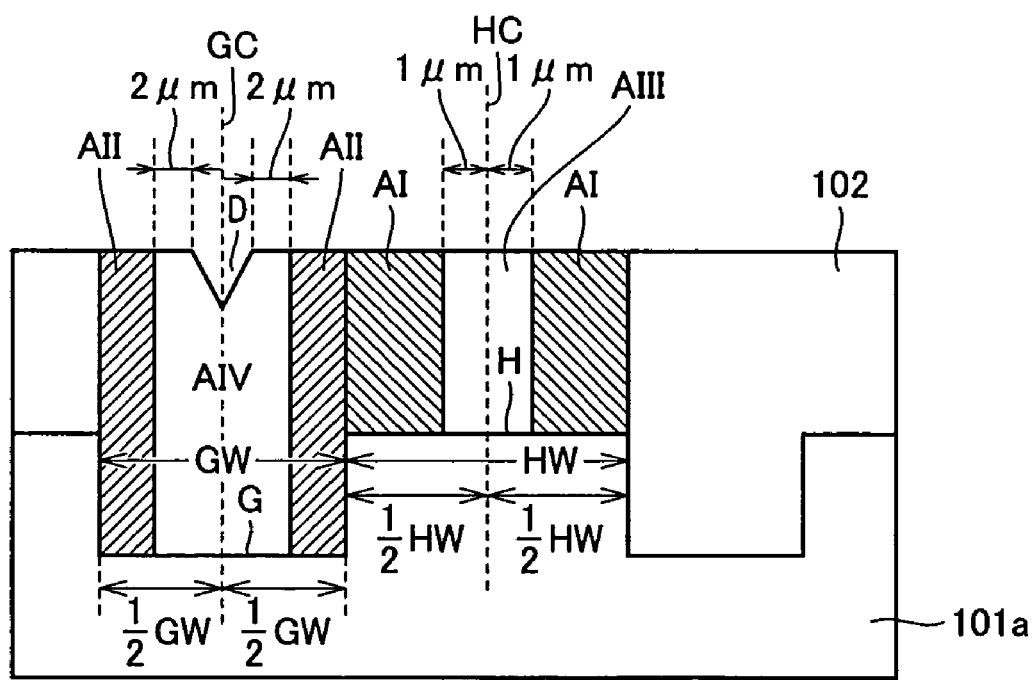

FIGS. 7A and 7B show above-described regions AI through AIV in schematic cross sectional views of the depressed substrates. Specifically, the light emitting portion of the nitride semiconductor laser device on the depressed substrate is preferably formed at least avoiding regions AIII and AIV, most preferably in region AI, and next preferably in region AII (see FIG. 6).

FIG. 7A shows the case that depression D is formed only in a region above hill H. By comparison, in the case that the region above hill H is completely and flatly covered with nitride semiconductor underlayer 102 as in the fifth through seventh embodiments as will be described later, region AI becomes a region above hill H and more than 1 μm away in the hill width direction from hill center HC to the left or to the right, as shown in FIG. 7B. If the light emitting portion is formed to be included in the range of less than 1 μm from the hill center on each side (region AIII in the case of not having a depression above the hill), the lasing lifetime would be decreased dramatically.

Similarly, as contrasted with the case of FIG. 7A where a depression is not formed above groove G, in the case that depression D is formed above the groove as in the third, sixth and seventh embodiments as will be described later, region AII becomes a region above the groove and more than 2 μm away to the left or to the right in the groove width direction from the closer depression edge (see FIG. 7B). If the light emitting portion is formed to be included in the range of less than 2 μm from either edge of the depression (in region AIV in the case of having a depression above the groove), the lasing lifetime would be decreased considerably.

The tendency similar to that shown in FIG. 6 was seen even when the groove width, the hill width and the ridge stripe width were varied. Further, when the processed substrate was changed from the one including the GaN substrate to the one including a non-nitride substrate, the tendency similar to that of FIG. 6 was again seen, though the lasing lifetime became shorter than in the case of the GaN substrate. Therefore, also in these cases, it is considered that the region for forming the light emitting portion of the light emitting device to be formed over a depressed substrate is similar as shown in FIGS. 7A and 7B. Similarly, in a light emitting diode (LED) device, it is possible to obtain the effect of the present invention as long as either region AI or AII as shown in FIGS. 7A and 7B exists beneath the light emitting portion into which electric current is introduced.

Further, although the nitride semiconductor laser device of FIG. 6 has a ridge stripe structure, the tendency similar to that of FIG. 6 can be obtained with a nitride semiconductor laser device having a current-blocking structure (in which case, the ridge stripe portion of FIG. 6 corresponds to a portion where current is constricted, and the ridge stripe width corresponds to the width of the current-constricting portion). That is, what is needed regarding the nitride semiconductor laser device is that there exists either region AI or AII as shown in FIGS. 7A and 7B beneath a light emitting portion into which current is introduced within a light emitting layer while being constricted and which practically contributes to lasing.

The lasing lifetime of the nitride semiconductor laser device having the current-blocking structure, however, was shorter by about 20–30% than that of the device having the ridge stripe structure described above. Further, reduction of the production yield due to occurrence of cracks was considerable in the nitride semiconductor laser devices having the current-blocking structure, compared to the devices having the ridge stripe structure. Although the reasons thereof are unclear yet, they may be related to the step of forming a current-constricting portion in the current-blocking layer and the step of crystal-growing the nitride semiconductor layer again over the current-blocking layer having the current-constricting portion formed therein. For example, a mask material such as a resist material is used in the step of forming the current-constricting portion in the current-blocking layer. Such a mask material may have remained being attached to the interior of the depression of the nitride semiconductor light emitting device of the present invention and, upon the next crystal growth, adversely affected the characteristics of the light emitting device. Further, in the step of crystal-growing the nitride semiconductor again on the current-blocking layer having the current-constricting portion formed therein, the light emitting device structure is temporarily taken out of the crystal growth system (to room temperature) to form the current-constricting portion in the current-blocking layer, and it is brought into the crystal growth system again to crystal-grow the remaining light emitting device structure (at about 1000° C.). When such thermal hysteresis involving drastic temperature changes is applied during the manufacturing process of the light emitting device structure, even if it is provided with the depression of the present invention, crystal strain within the light emitting device structure would not be alleviated sufficiently by the depression, leading to occurrence of cracks.

[Second Embodiment]

Figure 8B:
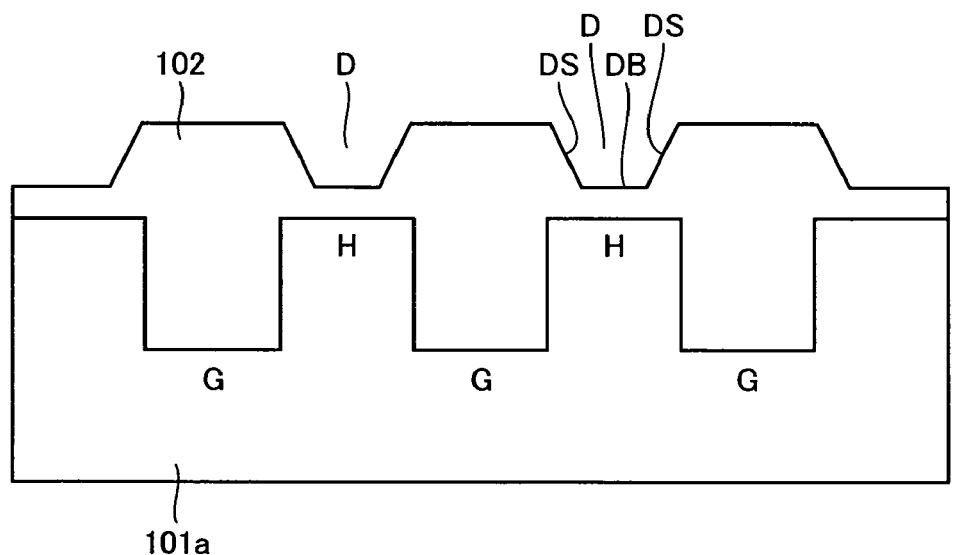

In a second embodiment, explanation is given for a method of forming a depressed substrate of the present invention with reference to FIGS. 3, 8A and 8B. The matters not specifically explained in the present embodiment are similar to those of the first embodiment described above. FIG. 3 is a schematic cross sectional view of the depressed substrate, showing a processed substrate 101a, a nitride semiconductor underlayer 102, and a depression D having side surfaces DS, a bottom DB, a depth DD, and edges E. FIG. 8A shows a depressed substrate in the case that the depression has a rectangular cross section, and FIG. 8B shows a depressed substrate in the case that the depression has an inverted trapezoid cross section (which becomes a V shape when crystal growth proceeds).

The processed substrates in FIGS. 8A and 8B can be produced in the following manner. Firstly, a dielectric film of $SiO_2$ or $SiN_x$ is formed on a (0001) main surface of an n type GaN substrate by evaporation. A resist material is applied on the dielectric film, and the resist material is patterned into stripes by lithography. The dielectric film and the surface of the GaN substrate are partly dry-etched along the mask pattern to form grooves. Thereafter, the resist material and the dielectric film are removed. Grooves G and hills H thus formed extend in a <1-100> direction of the n type GaN substrate, and have a groove width, a groove depth and a hill width of 18 μm, 3 μm and 7 μm, respectively. Alternatively, as shown in FIG. 2B, a processed substrate may be produced by forming a low-temperature GaN buffer layer BL on a sapphire substrate DS also having a (0001) main surface at a relatively low temperature of 500–600° C., and then forming an n type GaN layer 101c on the low-temperature GaN buffer layer, followed by the similar process as described above.

The processed substrate thus produced is subjected to organic cleaning thoroughly, and then transferred into a MOCVD (metallorganic chemical vapor deposition) system. A nitride semiconductor underlayer 102 of n type GaN film is grown to a covering film thickness of 6 μm. Specifically, $NH_3$ (ammonia) as a source material for the group V element and TMGa (trimethyl gallium) or TEGa (triethyl gallium) as a source material for the group III element are supplied on the processed substrate set in the MOCVD system, and $SiH_4$ (Si impurity concentration: $1 \times 10^{18}/cm^3$) is added to the source materials at a crystal growth temperature of 1050° C.

FIG. 8A shows the depressed substrate produced as described above in a schematic cross section. As seen from the figure, depression D was formed only in a region above hill H on the above-described growth conditions, and groove G was embedded flatly in n type GaN underlayer 102. Further, the depression was formed such that the center position of the depression width was approximately coincident with the center position of the hill width. Further, the depression had an approximately rectangular cross section when the groove was formed in the <1-100> direction of the GaN crystal.

A nitride semiconductor light emitting device of the present invention is formed on the depressed substrate produced in the above-described manner. The same applies to the other embodiments.

Other than the method of forming the grooves of the present embodiment, the resist material may be applied directly on the surface of the nitride semiconductor substrate for forming the processed substrate. However, it was preferable to form the groove via the dielectric film as described above, since the shape of the groove in such a case was favorably sharp.

When the processed substrate including a non-nitride substrate DS of sapphire or the like is utilized as shown in FIG. 2B, low-temperature GaN buffer layer BL may be replaced with a low-temperature AlN buffer layer. Here, the low-temperature buffer layer refers to a buffer layer that is formed at a growth temperature of about 500–600° C. as described above. The buffer layer formed at such a relatively low growth temperature range becomes amorphous or polycrystalline. In the case that SiC or Si is used for the non-nitride substrate, it is desired to use a high-temperature nitride semiconductor buffer layer (formed at a relatively high growth temperature of 700–1000° C.) including at least Al; otherwise crystallinity of a nitride semiconductor layer grown on the buffer layer would be degraded.

In the present embodiment, the n type GaN layer (nitride semiconductor underlayer) grown on the low-temperature GaN buffer layer may be an $Al_xGa_yIn_zN$ ($0 \leq x \leq 1$, $0 \leq y \leq 1$, $0 \leq z \leq 1$, x+y+z=1) layer, and Si, O, Cl, S, C, Ge, Zn, Cd, Mg or Be may be added therein.

Although the method of forming grooves by dry etching has been explained in the present embodiment, other groove forming methods may of course be employed, which includes, e.g., wet etching, scribing, wire saw processing, electric discharge machining, sputtering, laser beam machining, sand blasting, and focused ion beam machining.

Although the grooves have been formed in the <1-100> direction of the GaN crystal in the present embodiment, they may be formed in the <11-20> direction. As shown in FIG. 8B, depression D had a cross section of approximately inverted trapezoid, though it approaches a V shape as the bottom of the depression is gradually filled.

Although the (0001) main surface of the GaN substrate or the non-nitride substrate of sapphire has been utilized in the present embodiment, another non-nitride substrate and another surface orientation may be utilized. The groove width, the hill width and the groove depth on the processed substrate, and the covering film thickness of the nitride semiconductor underlayer described in the present embodiment may be changed to other numerical values if the numerical range conditions described in the first embodiment are satisfied. The same applies to the other embodiments.

[Third Embodiment]

Figure 9:
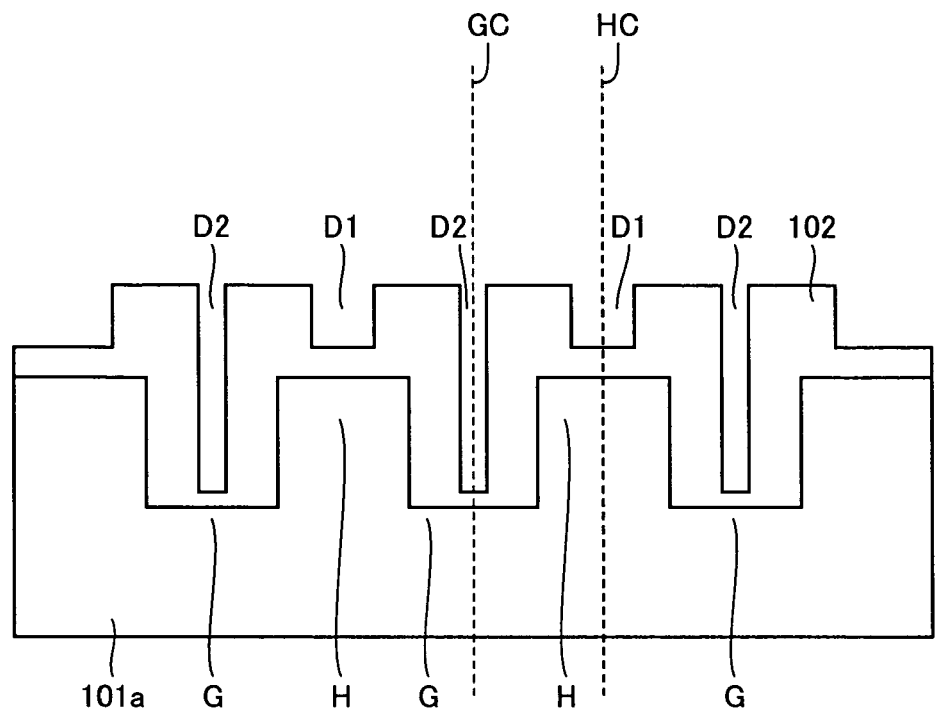
FIGS. 9–13 are schematic cross sectional views showing other examples of the depressed substrate usable in the present invention.

In a third embodiment, explanation is given for a method of producing a depressed substrate having depressions not only above a hill but also above a groove, with reference to FIG. 9. The matters not specifically explained in the present embodiment are similar to those of the first and second embodiments.

Specifically, processed substrate 101a and GaN underlayer 102 of FIG. 9 can be formed in a similar manner as in the second embodiment, though the covering film thickness of the GaN underlayer is relative shallow 3 μm.

Since the depressed substrate has depressions D not only above hill H but also above groove G, as explained in the above item titled "(Crystal Growth Manner of the Present Embodiment)" in the first embodiment, there is no crystal strain concentration portion where laterally growing crystals meet and coalesce each other, so that the substrate can be covered with GaN underlayer 102 having crystal strain almost alleviated.

The depressed substrate of the third embodiment can readily be obtained by primarily adjusting the thickness of GaN underlayer 102 covering processed substrate 101a to be thin.

[Fourth Embodiment]

A fourth embodiment is similar to the first and second embodiments except that the hills formed on the processed substrate have varied widths rather than a uniform width.

Figure 10:
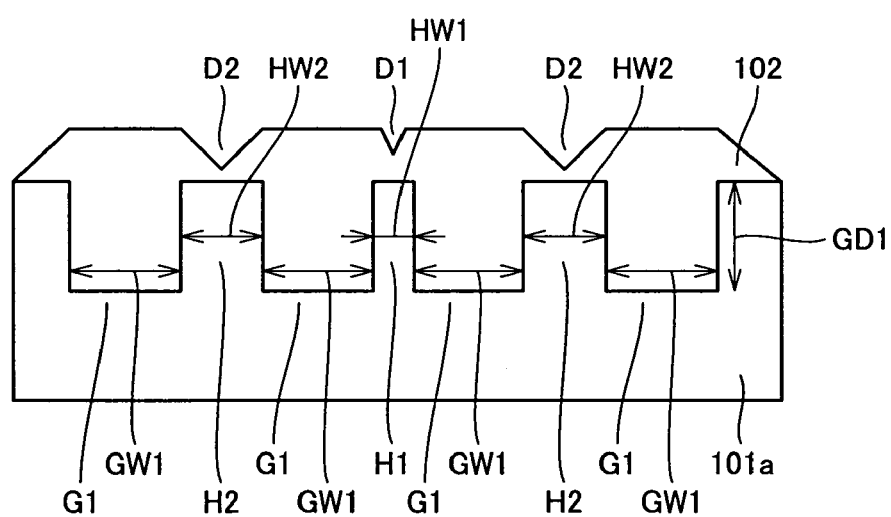

The schematic cross sectional view of FIG. 10 shows a depressed substrate according to the present embodiment. It has a groove width GW1 of 12 μm, a groove depth GD1 of 3 μm, and has two hill widths of HW1=8 μm and HW2=14 μm. An InGaN underlayer 102 is grown over processed substrate 101 to a covering film thickness of 5 μm, and the depressed substrate of the present embodiment is thus completed.

As seen from FIG. 10, when hill widths HW formed on the processed substrate are varied, a depression D2 formed above a relatively wide hill H2 tends to become bigger than a depression D1 formed above a narrow hill H1. A relatively large depression has greater effects of alleviating crystal strain and suppressing cracks as compared to a small depression. The depressed substrate including depressions varied in size as in the present embodiment is preferable in the following points.

Although a relatively small depression on the depressed substrate has smaller effects of alleviating crystal strain and suppressing cracks as compared to a large depression, it makes it possible to widen a region (corresponding to regions AI and AII in FIGS. 7A and 7B) where a light emitting device of a long lasing lifetime can be formed (this increases the number of light emitting device chips obtained per wafer). On the other hand, although a relatively large depression on the depressed substrate reduces a region where a light emitting device having a long lasing lifetime can be formed, residual crystal strain and occurrence of cracks that would not be suppressed by the small depression can be suppressed (this increases the yield of the light emitting device chips). As such, the depressed substrate of the present embodiment is preferable from the standpoints of the productivity and yield.

Although the processed substrate having two different hill widths HW has been explained in the present embodiment, a processed substrate having more than two different hill widths may of course be employed. The same applies to the other embodiments.

[Fifth Embodiment]

A fifth embodiment is similar to the fourth embodiment except that the hills formed on the processed substrate are varied in hill width and depression D1 (see FIG. 10) shown as in the fourth embodiment is completely and flatly covered with a nitride semiconductor film. The matters not specifically explained in the present embodiment are similar to those of the first and second embodiments.

Figure 11:
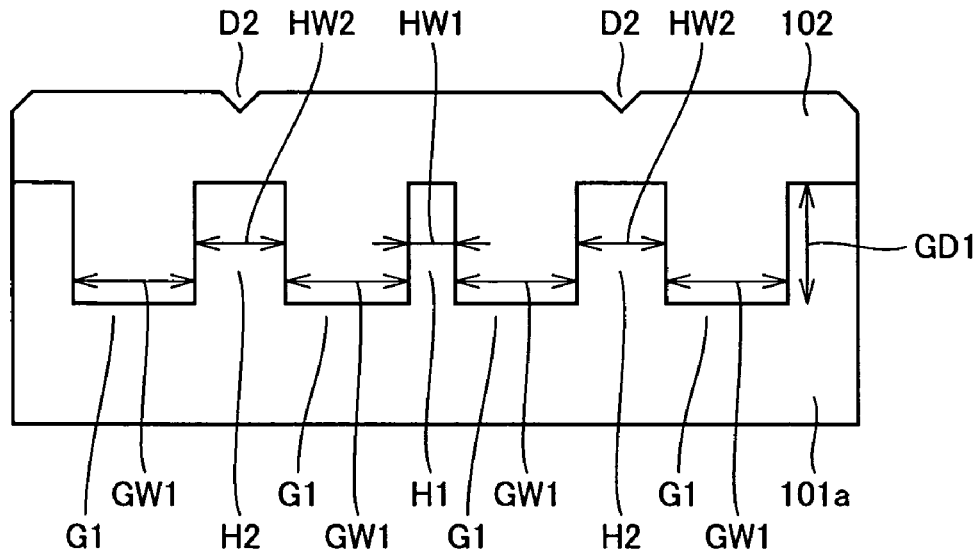

The schematic cross sectional view of FIG. 11 shows a depressed substrate of the present embodiment, which has a groove width GW1 of 16 μm, a groove depth GD1 of 2 μm, and two hill widths of HW1=4 μm and HW2=24 μm. An AlGaN underlayer 102 is grown over the processed substrate to a covering film thickness of 4 μm, and the depressed substrate of the fifth embodiment is thus completed.

As seen from FIG. 11, by varying the hill widths on the processed substrate, a depression D2 is formed above a relatively wide hill H2, while a region above a relatively narrow hill H1 is completely and flatly covered with AlGaN underlayer 102. The depressed substrate of the present embodiment is preferable in the following points.

Since a depression is not formed above hill H1 of the depressed substrate, although the effects of alleviating crystal strain and suppressing cracks may be small, a region where a light emitting device having a long lasing lifetime can be formed may become wider than that in the case of the fourth embodiment (this increases the number of light emitting device chips obtained per wafer). On the other hand, depression D2 formed above hill H2 of the depressed substrate has the effects of alleviating crystal strain and suppressing cracks (this increases the yield of the light emitting device chips). Thus, the depressed substrate having no depressions above some hills H1 and having depressions D2 above other hills H2 formed on the processed substrate is preferable from the standpoint of the productivity as compared to that of the fourth embodiment.

[Sixth Embodiment]

A sixth embodiment is similar to the first and second embodiments except that the grooves formed on the processed substrate are varied in depth.

Figure 12:
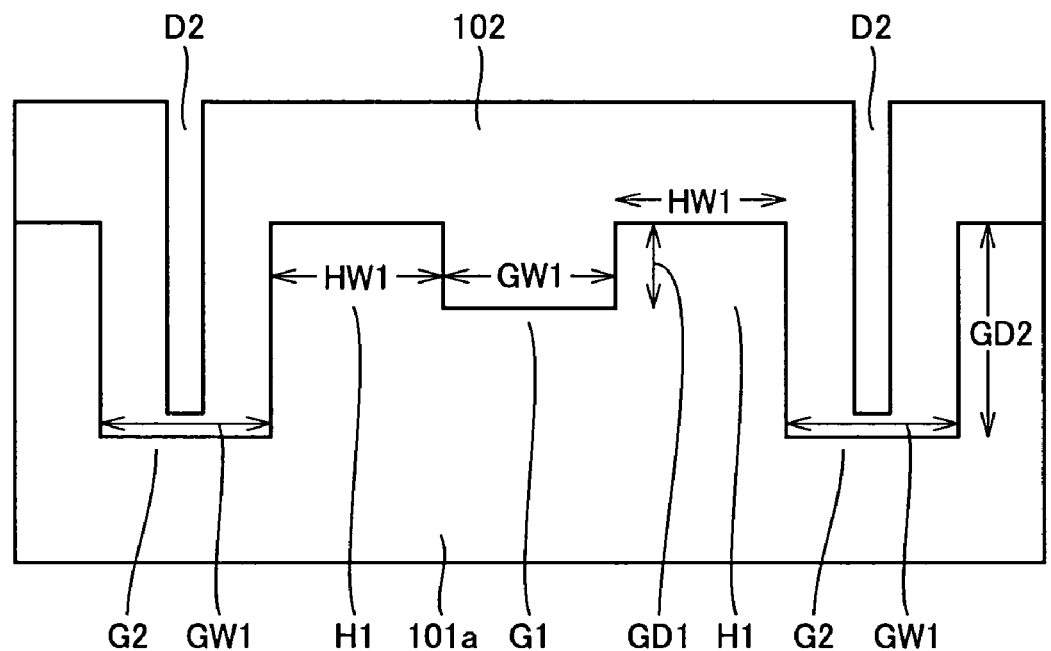

The schematic cross sectional view of FIG. 12 shows a depressed substrate of the present embodiment, which has a groove width GW1 of 18 μm, a hill width HW1 of 5 μm, and two groove depths of GD1=2.5 μm and GD2=10 μm. A GaN underlayer is grown over processed substrate 101a to a covering film thickness of 6 μm, and the depressed substrate of the sixth embodiment is thus completed.

As seen from FIG. 12, by varying the groove depths formed on the processed substrate, a depression D2 is formed only above a relatively deep groove G2. The depressed substrate of the present embodiment is preferable in the following points.

Although the effects of alleviating crystal strain and suppressing cracks may be small because of no depression formed except above groove G2 on the depressed substrate, it is possible to widen a region where a light emitting device of a long lasing lifetime can be formed (this increases the number of light emitting device chips obtained per wafer). On the other hand, depression D2 formed above groove G2 on the depressed substrate has the effects of alleviating crystal strain and suppressing cracks. Thus, the depressed substrate having depressions D2 formed above some grooves G2 and no depressions above other grooves G1 on the processed substrate is preferable from the standpoint of productivity of the light emitting device chips.

Although the processed substrate having two different groove depths has been explained in the present embodiment, a processed substrate having three or more different groove depths may of course be employed. Further, the present embodiment may of course be combined with at least one of the third through fifth embodiments.

[Seventh Embodiment]

A seventh embodiment is similar to the first and second embodiments except that the grooves formed on the processed substrate are varied in groove width.

Figure 13:
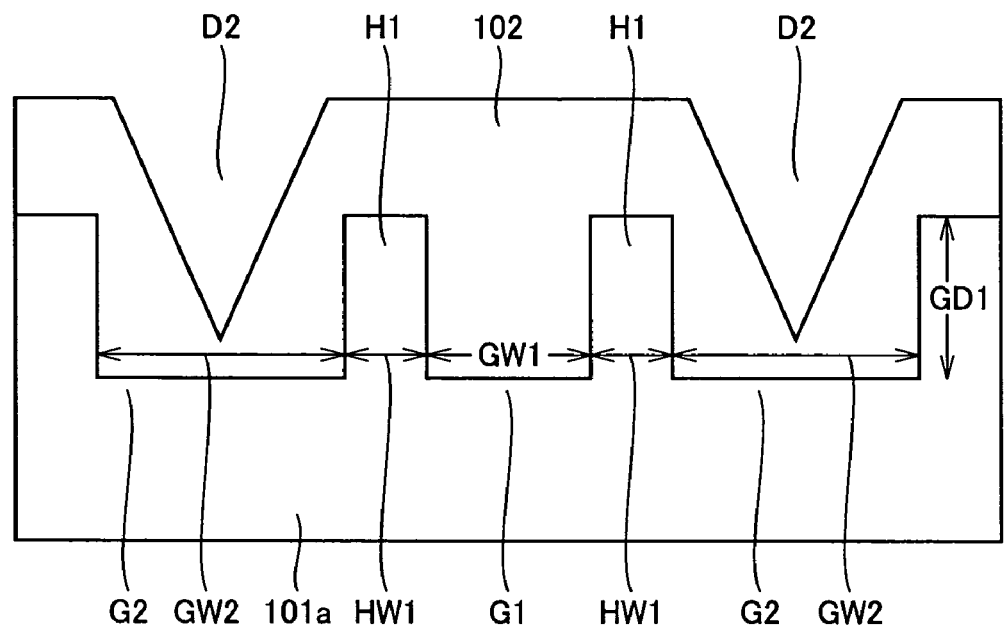

The schematic cross sectional view of FIG. 13 shows a depressed substrate of the present embodiment, which has a hill width HW1 of 5 μm, a groove depth GD1 of 4 μm, and two groove widths of GW1=12 μm and GW2=24 μm. A GaN underlayer is grown over this processed substrate 101a to a covering film thickness of 6 μm, and the depressed substrate of the seventh embodiment is thus completed.

As seen from FIG. 13, a depression D2 is formed only above a relatively wide groove G2 by varying the groove widths formed on the processed substrate. The depressed substrate of the present embodiment has the effects similar to those of the sixth embodiment described above.

Although the processed substrate having two different groove widths has been explained in the present embodiment, a processed substrate having more than two groove widths may of course be employed. Further, the present embodiment may of course be combined with at least one of the third through sixth embodiments.

[Eighth Embodiment]

In an eighth embodiment, a nitride semiconductor laser device may be formed on a depressed substrate of the first through seventh embodiments.

(Crystal Growth)

FIG. 1 shows a nitride semiconductor laser device after a wafer having nitride semiconductor lasers grown on the depressed substrate is divided into chips. The nitride semiconductor laser device shown in FIG. 1 includes a depressed substrate 100 composed of a processed substrate (n type GaN substrate) 101a and an n type $Al_{0.05}Ga_{0.95}N$ underlayer 102, an n type $In_{0.07}Ga_{0.93}N$ anti-crack layer 103, an n type $Al_{0.1}Ga_{0.9}N$ clad layer 104, an n type GaN light guide layer 105, a light emitting layer 106, a p type $Al_{0.2}Ga_{0.8}N$ carrier block layer 107, a p type GaN light guide layer 108, a p type $Al_{0.1}Ga_{0.9}N$ clad layer 109, a p type GaN contact layer 110, an n electrode 111, a p electrode 112, and a $SiO_2$ dielectric film 113.

In formation of such a nitride semiconductor laser device, firstly, a depressed substrate 100 according to any of the first through seventh embodiments is formed, though the groove direction is in the <1-100> direction of the GaN substrate as in the eighth embodiment.

Next, using a MOCVD system, $NH_3$ (ammonia) as a source material for the group V element and TMGa (trimethyl gallium) or TEGa (triethyl gallium) as a source material for the group III element are added with TMIn (trimethyl indium) as a source material for the group III element and $SiH_4$ (silane) as an impurity over depressed substrate 100, to grow n type $In_{0.07}Ga_{0.93}N$ anti-crack layer 103 to a thickness of 40 nm at a crystal growth temperature of 800° C. Next, the substrate temperature is raised to 1050° C., and TMAl (trimethyl aluminum) or TEAl (triethyl aluminum) as a source material for the group III element is provided to grow n type $Al_{0.1}Ga_{0.9}N$ clad layer 104 (Si impurity concentration: $1\times10^{18}/cm^3$) to a thickness of 0.9 μm. N type GaN light guide layer 105 (Si impurity concentration: $1\times10^{18}/cm^3$) is then grown to a thickness of 0.1 μm.

Thereafter, the substrate temperature is lowered to 800° C., and light emitting layer (of multiple quantum well structure) 106 including 8 nm thick $In_{0.01}Ga_{0.99}N$ barrier layers and 4 nm thick $In_{0.15}Ga_{0.85}N$ well layers stacked alternately with each other is formed. In the present embodiment, light emitting layer 106 has the multiple quantum well structure starting and ending both with the barrier layers, including 3 quantum well layers (i.e., 3 cycles). The barrier and well layers are both doped with Si impurity at a concentration of $1\times10^{18}/cm^3$. A crystal growth break interval of at least one second and at most 180 seconds may be provided between growth of the barrier layer and growth of the well layer, or between growth of the well layer and growth of the barrier layer. This can improve flatness of the respective layers and also decrease the half-width of emission peak in the emission spectrum.

$AsH_3$ or TBAs (tertiary butyl arsine) may be used to add As in light emitting layer 106. Similarly, $PH_3$ or TBP (tertiary butyl phosphine) may be used to add P, and TMSb (trimethyl antimony) or TESb (triethyl antimony) may be used to add Sb in light emitting layer 106. $NH_3$ as the source material of N may be replaced with dimethyl hydrazine in the formation of the light emitting layer.

Next, the substrate temperature is raised again to 1050° C. to successively grow 20 nm thick p type $Al_{0.2}Ga_{0.8}N$ carrier block layer 107, 0.1 μm thick p type GaN light guide layer 108, 0.5 μm thick p type $Al_{0.1}Ga_{0.9}N$ clad layer 109, and 0.1 μm thick p type GaN contact layer 110. As the p type impurity, Mg ($EtCP_2Mg$: bisethylcyclopentadienyl magnesium) is added at a concentration from $5\times10^{19}/cm^3$ to $2\times10^{20}/cm^3$. The p type impurity concentration in p type GaN contact layer 110 is preferably increased as it approaches the interface with p electrode 112. This can reduce the contact resistance at the interface with the p electrode. Further, oxygen may be added by a minute amount during growth of the p type layers, to remove residual hydrogen in the p type layers that hinders activation of the p type impurity Mg.

After the growth of p type GaN contact layer 110, the entire gas in the reactor of the MOCVD system is replaced with nitrogen carrier gas and $NH_3$, and the substrate temperature is decreased at a cooling rate of 60° C./min. Supply of $NH_3$ is stopped when the substrate temperature is decreased to 800° C. The substrate is maintained at that temperature for five minutes, and then cooled to room temperature. The substrate is temporarily held at a temperature preferably in a range from 650° C. to 900° C., for a time period preferably in a range from 3 minutes to 10 minutes. The cooling rate to the room temperature is preferably more than 30° C./min. The film thus crystal-grown was evaluated by Raman spectroscopy, and it was found that the grown film already had the p type characteristic (with Mg activated), even without conventional annealing for giving the p type characteristic. The contact resistance in formation of p electrode 112 was also reduced. When the conventional annealing for giving the p type characteristic was additionally applied, the activation ratio of Mg further improved favorably.

In the crystal growth method of the present embodiment, crystal growth from the processed substrate to the nitride semiconductor laser device may be done continuously. Alternatively, growth from the processed substrate to the depressed substrate may be done in advance, followed by growth of the nitride semiconductor laser device.

$In_{0.07}Ga_{0.93}N$ anti-crack layer 103 of the present embodiment may have the In composition ratio of other than 0.07, or the layer itself may be omitted. However, the InGaN anti-crack layer is preferably inserted when there is a large lattice mismatch between the clad layer and the GaN substrate.

Although light emitting layer 106 of the present embodiment has the structure starting and ending both with the barrier layers, it may have a structure starting and ending both with the well layers. The number of well layers within the light emitting layer is not restricted to 3 described above. The threshold current density is sufficiently low with at most 10 well layers, enabling continuous lasing at room temperature. In particular, the well layers of at least 2 and at most 6 are preferable, ensuring the low threshold current density.

While Si has been added in both the well and barrier layers at a concentration of $1 \times 10^{18}/cm^3$ in light emitting layer 106 of the present embodiment, it may be added to none of the layers. However, the luminous intensity of the light emitting layer was increased when Si was added therein. At least one of O, C, Ge, Zn and Mg, besides Si, may be employed as the impurity to be added in the light emitting layer. The total impurity dose is preferably about $1 \times 10^{17}/cm^3$ to $1 \times 10^{19}/cm^3$. Further, the impurity may be added only in either of the well and barrier layers, instead of both of the layers.

P type $Al_{0.2}Ga_{0.8}N$ carrier block layer 107 of the present embodiment may have the Al composition ratio of other than 0.2, or the carrier block layer itself may be omitted. The threshold current density, however, was lowered with provision of the carrier block layer, because carrier block layer 107 has a function to confine the carriers in light emitting layer 106. The Al composition ratio of the carrier block layer is preferably set high to enhance the carrier confining effect. When the Al composition ratio is set low within the range guaranteeing the carrier confinement, mobility of the carriers in the carrier block layer increases, leading to favorable reduction of electric resistivity.

Although $Al_{0.1}Ga_{0.9}N$ crystals have been employed for p type clad layer 109 and n type clad layer 104 in the present embodiment, the Al composition ratio may be other than 0.1. If the Al composition ratio is increased, differences in energy gap and in refractive index compared with light emitting layer 106 increase, so that carriers and light can efficiently be confined in the light emitting layer, leading to reduction of the lasing threshold current density. By comparison, if the Al composition ratio is lowered within the range ensuring confinement of carriers and light, mobility of the carriers in the clad layers increases, so that it is possible to reduce operation voltage of the device.

The AlGaN clad layer preferably has a thickness of 0.7–1.5 μm. This ensures a unimodal vertical transverse mode and increases the light confining effect, and further enables improvement in optical characteristics of the laser and reduction of the lasing threshold current density.

The clad layer is not restricted to the ternary mixed crystal of AlGaN. It may be a quaternary mixed crystal of AlInGaN, AlGaNP, AlGaNAs or the like. Further, the p type clad layer may have a super-lattice structure composed of p type AlGaN layers and p type GaN layers or a super-lattice structure composed of p type AlGaN layers and p type InGaN layers for the purpose of reducing its electric resistivity.

Although the crystal growth using the MOCVD system has been explained in the present embodiment, molecular beam epitaxy (MBE), hydride vapor phase epitaxy (HVPE) or the like may also be used for the crystal growth.

(Processing into Chips)

The epi-wafer obtained by the above-described crystal growth (i.e., the wafer having the nitride semiconductor multilayered structure epitaxially grown on the processed substrate) is taken out of the MOCVD system and processed into laser devices. Here, the surface of the nitride semiconductor multilayered structure included in the epi-wafer has depressions, rather than being embedded completely and flatly.

Processed substrate 101a is a nitride semiconductor of an n type conductivity, so that Hf and Al are deposited in this order on its back side to form n electrode 111 (see FIG. 1). Ti/Al, Ti/Mo, Hf/Au or the like may also be used as the materials for the n electrode. Hf is preferably used for the n electrode to decrease its contact resistance.

The p electrode portion is etched in a stripe shape in the groove direction of processed substrate 101a, to form a ridge stripe portion RS (see FIG. 1). When the processed substrate has grooves arranged in a grid pattern, either the <1-100> direction or the <11-20> direction of the nitride semiconductor may be selected as the longitudinal direction of the grooves. The ridge stripe portion is formed to have a stripe width W=2.0 μm and to be included in region AI described above (see FIG. 1). Thereafter, $SiO_2$ dielectric film 113 is formed by evaporation, and an upper surface of p type GaN contact layer 110 is exposed from the dielectric film. On the exposed surface of the contact layer, p electrode 112 as stacked layers of Pd/Mo/Au is formed by evaporation. Stacked layers of Pd/Pt/Au, Pd/Au, Ni/Au or the like may also be used for the p electrode. Further, a pad electrode of Au may be provided between p electrode 112 and wire bond WB.

Lastly, the epi-wafer is cloven in a direction perpendicular to the longitudinal direction of the ridge stripe, to form Fabri-Perot resonators each having a 500 μm length. In general, the resonator length is preferably in a range from 300 μm to 1000 μm. The mirror end surfaces of the resonator formed in the <1-100> direction of the groove correspond to the M plane {1-100} of the nitride semiconductor crystal. Cleavage for formation of the mirror end surfaces and division into laser chips are carried out with a scriber on the back side of processed substrate 101a. The cleavage is done with the scriber, by scratching not the entire back side of the wafer but only portions of the wafer, e.g., only the both ends of the wafer. This prevents degradation of sharpness of the end surfaces of the device, and also prevents shavings due to the scribing from attaching to the epi-surface, thereby improving the yield of the devices. On the surface of the nitride semiconductor light emitting device after chip division, there are at least two depressions sandwiching the ridge stripe portion of the device. Further, p electrode 112 is formed on an area including at least two depressions, and wire bond WB is formed on an area including at least one depression D.

As the feedback method of the laser resonator, commonly known DFB (distributed feedback), DBR (distributed bragg reflector) or the like may also be employed.

After formation of the mirror end surfaces of the Fabri-Perot resonator, dielectric films of $SiO_2$ and $TiO_2$ are alternately formed on one of the mirror end surfaces by evaporation, to make a dielectric multilayer reflection film having a reflectance of 70%. Alternatively, multilayer films of $SiO_2/Al_2O_3$ or the like may be used for the dielectric multilayer reflection film.

Although n electrode 111 has been formed on the back side of processed substrate 101a, a part of n type $Al_{0.05}Ga_{0.95}N$ film 102 may be exposed from the front side of the epi-wafer by dry etching, to form the n electrode in the exposed area.

(Packaging)

The semiconductor laser device obtained is mounted to a package. For a nitride semiconductor laser device of high output (greater than 30 mW), attention should be paid to measures for heat dissipation. A high output nitride semiconductor laser device may be connected being junction-up or junction-down to a package body, using an In solder, a PbSn-based solder, an AuSn-based solder or the like, though the junction-down state is more preferable from the standpoint of heat dissipation. Alternatively, the high output nitride semiconductor laser device may be connected via a sub-mount of Si, AlN, diamond, Mo, CuW, BN, Fe, SiC, Cu, or Au, though it is normally attached directly to the package body or a heat sink portion.

The nitride semiconductor laser device of the present embodiment is thus completed.

Although processed substrate 101a of GaN has been used in the present embodiment, a processed substrate of another nitride semiconductor may be employed. For example, in the case of a nitride semiconductor laser, it is preferable that a layer having a refractive index lower than that of a clad layer is in contact with the outside of the clad layer to obtain a unimodal vertical transverse mode, and an AlGaN substrate may be employed preferably.

In the present embodiment, the nitride semiconductor laser device is formed on the depressed substrate, so that crystal strain is alleviated and occurrence of cracks is suppressed. Thus, a lasing lifetime of about 18000 hours is obtained, and improvement of the device yield is achieved by the crack suppressing effect.

[Ninth Embodiment]

Firstly, the inventors examined differences in device characteristics between the case that the nitride semiconductor laser device was produced in a conventional manner and the case that the nitride semiconductor laser device was produced according to the present embodiment.

As a case A of the present embodiment, a nitride semiconductor laser device was formed by growing a nitride semiconductor multilayered structure having depressions left by incomplete covering, on a mask substrate having a growth inhibiting film formed on a nitride semiconductor substrate (e.g., a GaN substrate) shown in FIG. 14A. In this case, the lasing lifetime of the laser device was about 18000 hours.

Figure 14B:
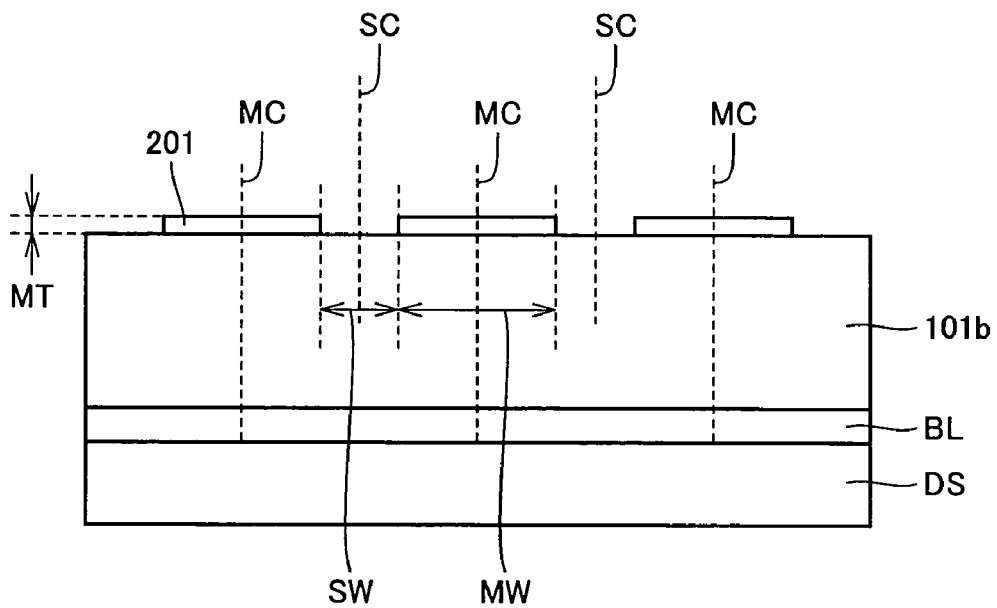
FIG. 14B is a cross sectional view showing a mask substrate including a base substrate, which are usable in the present invention.

As another case B of the present embodiment, a nitride semiconductor laser device was formed by growing a nitride semiconductor multilayered structure having depressions left by incomplete covering, on a mask substrate having a growth inhibiting film formed above a base substrate (e.g., a sapphire substrate) shown in FIG. 14B. In this case, the lasing lifetime of the laser device was about 5000 hours.

Next, as a case C of the conventional technique, a nitride semiconductor laser device was formed by growing a nitride semiconductor multilayered structure having a surface covered completely and flatly without leaving depressions, on a mask substrate having a growth inhibiting film formed on a nitride semiconductor substrate shown in FIG. 14A. In this case, the lasing lifetime of the laser device was about 1500 hours.

Further, as another case D of the conventional technique, a nitride semiconductor laser device was formed by growing a nitride semiconductor multilayered structure having a surface covered completely and flatly without leaving depressions, on a mask substrate having a growth inhibiting film formed on a base substrate shown in FIG. 14B. In this case, the lasing lifetime of the laser device was about 500 hours.

Figure 19:
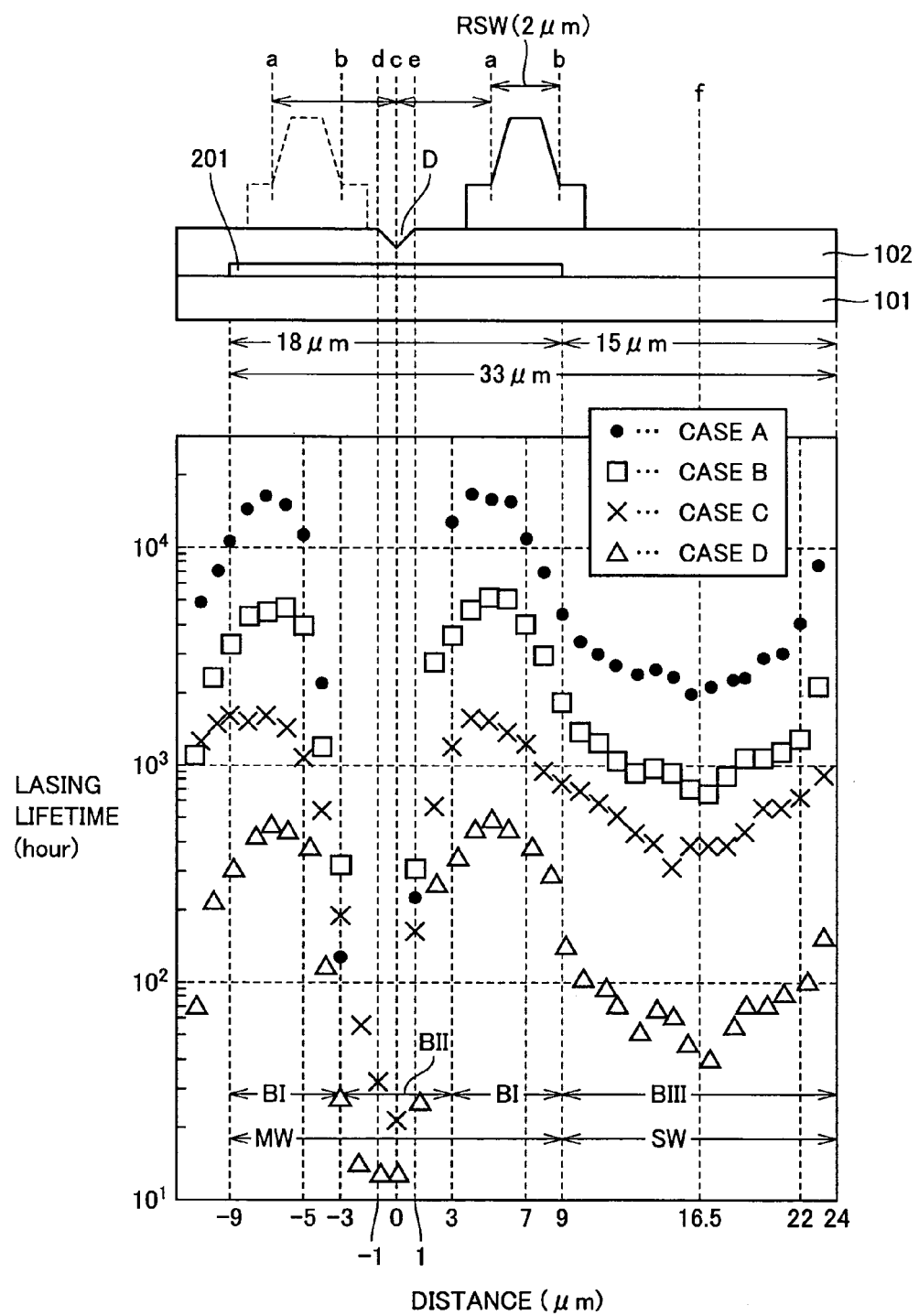
FIG. 19 shows the relation between a position of a ridge stripe portion of a nitride semiconductor laser device formed on a depressed substrate including a mask substrate usable in the present invention and a lasing lifetime of the device.

These examination results are plotted on a graph of FIG. 19. Although the details will be described later, it is found that nitride semiconductor laser devices of very long lasing lifetimes can be obtained in cases A and B (particularly in case A). It is considered that such results are attributable to the differences in magnitude and distribution of the crystal lattice strain existent within the nitride semiconductor films in the respective cases.

In each of cases A and B, the light emitting device is formed with depressions being present on the surface. By comparison, in each of cases C and D, the laser device is formed with no depressions being formed on the surface by the conventional technique. In the case of the surface having no depressions, when lateral growth of the nitride semiconductor multilayered structures proceeds over the growth inhibiting film from its both sides and they meet each other and coalesce near the center of the growth inhibiting film, large crystal lattice strain will occur at the coalesced portion.

Figure 16A:
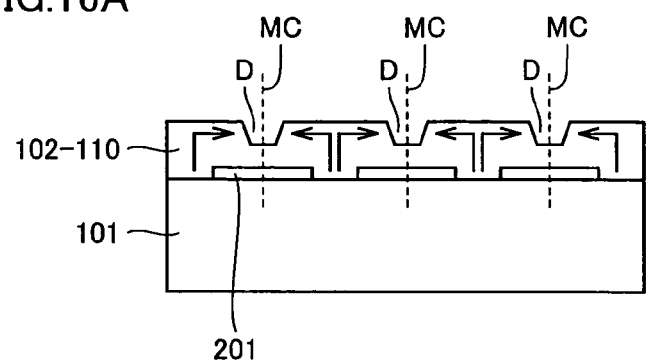
FIGS. 16A–16D are schematic cross sectional views showing manners of crystal growth of nitride semiconductor films on mask substrates.
Figure 16B:
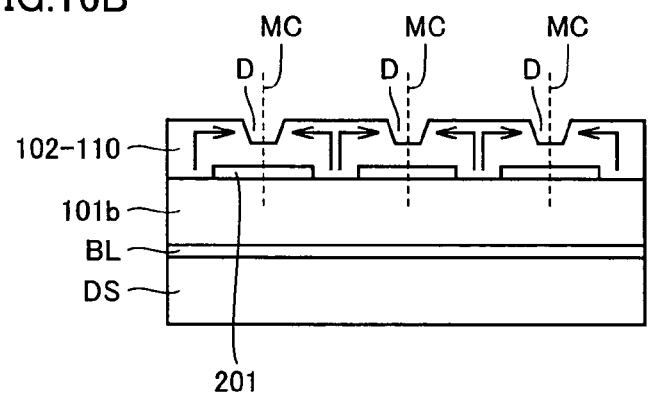
Figure 16C:
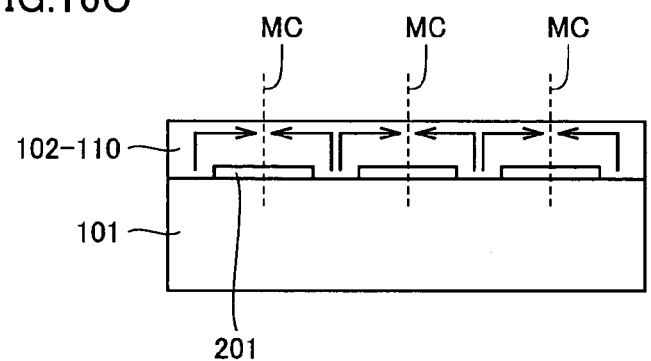

FIG. 16C shows a crystal growth manner of the case C in which the mask substrate of FIG. 14A is used to grow the nitride semiconductor multilayered structure. In this case, crystal growth of nitride semiconductor multilayered structure 102–110 begins in a window region where GaN substrate 101 is uncovered with growth inhibiting film 201. The nitride semiconductor multilayered structure grows in the window region in the normal crystal growth direction (perpendicular to the main surface of the substrate). When the nitride semiconductor multilayered structure grows thicker than the growth inhibiting film, growth in a horizontal direction (lateral growth) parallel to the main surface of the substrate proceeds on the growth inhibiting films, so that the nitride semiconductor multilayered structures are formed on the growth inhibiting films. Thereafter, the nitride semiconductor multilayered structures having laterally grown from opposite sides of growth inhibiting film 201 to the proximity of the center MC meet each other and coalesce, thereby covering the entire surface of the growth inhibiting film. At this time, crystal lattice strain occurs due to the coalescence of the films.

On the other hand, FIG. 16A shows a crystal growth manner of the nitride semiconductor multilayered structure in case A. In this case, coalescence of nitride semiconductor multilayered structures 102–110 due to the lateral growth does not completely occur and leaves depression D in the surface portion, so that it is possible to reduce the crystal lattice strain caused by the coalescence. Such a feature presumably affects the lasing lifetime of the laser device, and thus the lasing lifetime extends in case A than in case C, and in case B than in case D.

Further, although depressions exist on the surfaces of nitride semiconductor multilayered structures 102–110 in both cases A and B, the lasing lifetime becomes longer in case A than in case B. In case A, nitride semiconductor substrate 101 is used, and thus there is only a small difference in thermal expansion coefficient between the substrate and the nitride semiconductor multilayered structure stacked thereon, compared to the case using the base substrate DS. However, the nitride semiconductor multilayered structure includes nitride semiconductor layers of mixed crystals of various compositions, and difference between their thermal expansion coefficients causes crystal lattice strain and affects the lasing lifetime. On the other hand, since case B uses a sapphire substrate as base substrate DS in addition to the cause of crystal lattice strain described in case A, there is a big difference in thermal expansion coefficient between sapphire and the nitride semiconductors and thus there exists a great crystal strain component within the nitride semiconductor multilayered structure caused by the difference. A crystal growth manner in this case is shown in FIG. 16B. In this case, even though the crystal lattice strain caused by the coalescence due to the lateral growth is alleviated by leaving depression D, the crystal lattice strain caused by using the base substrate is large, so that the crystal lattice strain cannot be alleviated to the extent of the case of using the nitride semiconductor substrate. This is considered why the lasing lifetime extends longer in case A than in case B.

In cases A and B, the effect of alleviating the crystal lattice strain is obtained by forming depressions on the surface. If the nitride semiconductor multilayered structure is grown such that a gap is formed between the growth inhibiting film and the depression above the growth inhibiting film, the effect of alleviating the crystal lattice strain can also be obtained in the gap portion. In this case, it is still required that the nitride semiconductor multilayered structure includes grown layers each at least partially continuous in the lateral direction.

As described above, in the cases of employing various kinds of substrates, there occurs difference in magnitude and distribution of crystal lattice strain between the nitride semiconductor multilayered structures, thereby causing difference in lasing lifetime between the semiconductor laser devices.

Use of the processed substrate described above is advantageous in that it is not affected by impurities or the difference in thermal expansion coefficient due to the growth inhibiting film in the mask substrate.

The inventors have found that occurrence of cracks within the nitride semiconductor multilayered structure can also be suppressed by utilizing the crystal growth manner of the ninth embodiment, similarly as in the case of the first embodiment. Accordingly, the product yield of the nitride semiconductor laser devices is improved.

For example, in the case A that the nitride semiconductor laser device including depressions on the surface was formed using the GaN substrate as shown in FIG. 16A, crack density was 0–3 cracks/cm$^2$. On the other hand, in the case C that the nitride semiconductor light emitting device having no depressions on the surface was formed on a conventional GaN substrate as shown in FIG. 16C, although it had conventionally been considered that cracks would hardly occur, many cracks actually occurred within the epi-wafer plane after the light emitting device was grown. This is presumably because the light emitting device includes various stacked layers (e.g., the AlGaN layer has a lattice constant smaller than that of the GaN layer, and the InGaN layer has a lattice constant greater than that of the GaN layer). Further, it is considered that a currently available GaN substrate includes latent residual strain in itself. Thus, when the nitride semiconductor laser device was formed on the conventional GaN substrate, crack density was about 5–8 cracks/cm$^2$. From the foregoing, it has been found that the crack density can be reduced by utilizing the crystal growth manner of the present embodiment.

Figure 16D:
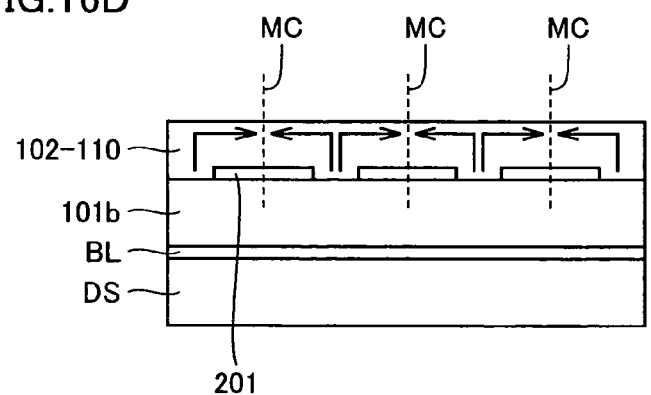

On the other hand, in the case B that a nitride semiconductor laser device having depressions on the surface was formed using a non-nitride substrate DS of sapphire as shown in FIG. 16B, crack density was about 3–5 cracks/cm$^2$. By comparison, in the case D that a nitride semiconductor laser device having no depressions on the surface was formed using a sapphire substrate as shown in FIG. 16D, crack density was about 7–10 cracks/cm$^2$.

Further, it has been found that the effect of suppressing cracks by depressions in the ninth embodiment has the following characteristics, similarly as in the case of the first embodiment. When two or more depressions are included in one nitride semiconductor light emitting device after chip division, the rate of occurrence of cracks is decreased by about 30% compared to the case that the device has one depression. In addition, particularly in the case that a ridge stripe portion RS is provided between two depressions D as in the nitride semiconductor light emitting device (laser device) having a ridge stripe structure shown in FIG. 20, for example, the yield of the light emitting devices is improved.

It has also been found that the depressions of the ninth embodiment have the following effect on an electrode of the nitride semiconductor light emitting device after chip division, similarly as in the case of the first embodiment. When two or more depressions of the present invention are included in one nitride semiconductor light emitting device, the rate of defective devices due to electrode peeling is reduced by about 20% compared to the case that the device has one depression. In addition, in the case that a ridge stripe portion is provided between two depressions D as in the nitride semiconductor light emitting device having a ridge stripe structure shown in FIG. 20, for example, peeling of p electrode 112 (including the pad electrode) particularly at the ridge stripe portion is prevented, and the yield of the light emitting devices is improved. An effect similar to the effect of preventing electrode peeling at the ridge stripe portion was also obtained against peeling of the dielectric film, e.g., SiO$_2$ dielectric film 113 shown in FIG. 20.

Further, it has been found that the depressions of the ninth embodiment have the following effect on wire bond WB of the nitride semiconductor light emitting device after chip division. When at least one depression of the present invention is included in a bonding area between the wire bond and the nitride semiconductor light emitting device, peeling of the wire bond itself or peeling of the electrode including the wire bond is reduced by about 20%. This means that it is preferable that the bonding area between the wire bond and the nitride semiconductor light emitting device includes at least one depression of the present invention.

(Mask Substrate)

When a nitride semiconductor substrate is utilized in the present embodiment, the mask substrate is composed of the nitride semiconductor substrate and a patterned growth inhibiting film. When a base substrate is utilized, the mask substrate is composed of the base substrate, a nitride semiconductor substrate layer on the base substrate, and a patterned growth inhibiting film thereon. There is only a small difference in thermal expansion coefficient between the nitride semiconductor substrate and the nitride semiconductor film formed thereon, so that bowing of the substrate is much smaller than in the case of utilizing the base substrate. Thus, the growth inhibiting film formed on the nitride semiconductor substrate and even the depressions can be formed and located with high precision compared to those formed on the nitride semiconductor substrate layer laminated on the base substrate. Further, since the bowing of the substrate is very small, it is possible to produce the light emitting device structure with high precision, avoiding a region liable to cause a device defect (e.g., shortening of the lasing lifetime), as will be described later in "(Position for Forming Light Emitting Portion)". Still further, the small bowing of the substrate itself serves to prevent new strain and occurrence of cracks, thereby producing additional effects of extending the lifetime of the semiconductor laser device and reducing other defects in device characteristics. Thus, it is preferable to utilize the nitride semiconductor substrate rather than the base substrate.

(Thickness of Nitride Semiconductor Underlayer Covering Mask Substrate)

In the present embodiment, the nitride semiconductor underlayer covering the mask substrate may be grown thin in order to leave depressions which are not covered flatly with the nitride semiconductor multilayered structure over the mask substrate. Although depressions are formed on the underlayer above the growth inhibiting film regions of the mask substrate, it is required that the underlayer also has a flat portion for forming the semiconductor laser device. Thus, the covering film thickness of the nitride semiconductor underlayer is preferably more than 2 μm and less than 20 μm. If the covering film thickness becomes thinner than 2 μm, it begins to become difficult to obtain the underlayer region sufficiently flat for forming the light emitting portion of the semiconductor laser device above the growth inhibiting film, though it depends on width and thickness of the growth inhibiting film of the mask substrate. If the covering film thickness becomes thicker than 20 μm, the effects of alleviating crystal strain and suppressing cracks by depressions are surpassed by stress strain due to the difference in thermal expansion coefficient between the mask substrate and the nitride semiconductor underlayer (or the nitride semiconductor multilayered structure), in which case the effect of the present invention cannot be achieved sufficiently.

(Mask Width)

The growth inhibiting film of the mask substrate can readily be embedded in the nitride semiconductor underlayer if the mask width is relatively narrow, whereas it cannot readily be embedded if the mask width is wide. According to a result of investigation of the inventors, a mask width MW1 for causing depressions by incompletely covering the growth inhibiting films of the mask substrate with the nitride semiconductor underlayer is preferably more than 7 μm and less than 75 μm, though it may be more than 7 μm and less than 100 μm. However, since the proper mask width MW1 depends on the thickness of the nitride semiconductor underlayer or the nitride semiconductor multilayered structure covering the mask substrate, it is necessary to adjust the covering film thickness of the nitride semiconductor underlayer as well as mask width MW1 to generate the depressions above the growth inhibiting films.

The lower and upper limits of mask width MW1 are estimated from the following standpoints. The lower limit of mask width MW1 of the growth inhibiting film depends on a size of the light emitting portion within the light emitting device. For example, in the case that a nitride semiconductor laser device is formed above the growth inhibiting film having mask width MW1 for causing a depression, it is preferable from the standpoint of a lasing lifetime that the light emitting portion beneath the ridge stripe of the laser device belongs to a region BI in FIG. 17. Since the ridge stripe is formed with a width of about 1–3 μm and a minimal depression width can be estimated to be 1 μm, the lower limit of mask width MW1 needs to be more than 7 μm which corresponds to a sum of the width of a region BII including the depression, i.e., depression width (1 μm)+2 μm×2 (see FIG. 8), and the stripe width (1 μm)×2.

On the other hand, the upper limit of mask width MW1 is not set specifically. However, if mask width MS1 is made too wide, depression density per unit area of wafer decreases, and the effects of alleviating crystal strain and suppressing cracks are reduced. The number of chips obtained per wafer also decreases. Thus, the upper limit of mask width MW1 is desired to be less than 100 μm.

Although the mask substrate having only the mask width changed has been described above, it is of course possible to form the mask substrate by changing not only the mask width but also the mask thickness and/or space width as will be described later. The same applies to the mask substrate in the other embodiments.

Here, the depression width is defined as follows. The shape of the depression may change according to the growth conditions of the nitride semiconductor underlayer or the aligned direction of the growth inhibiting film, and the depression width may not be constant. In such a case, the depression width is defined as the width of a portion which is widest in the width direction of the ridge stripe of the nitride semiconductor laser device.

(Mask Thickness)

The mask formed on the nitride semiconductor substrate is easy to be embedded in the nitride semiconductor underlayer when it is relatively thin, and difficult to be embedded in the underlayer when it is thick. According to a result of investigation of the inventors, a mask thickness T1 for causing depressions by incompletely covering the growth inhibiting films of the mask substrate with the nitride semiconductor underlayer is preferably more than 0.05 μm and more preferably more than 0.1 μm. In the case that mask thickness T1 is thinner than 0.05 μm, it becomes difficult to control the mask thickness, and the growth inhibiting film may be degraded when the substrate temperature is raised for growth of the nitride semiconductor underlayer, in which case the nitride semiconductor substrate may be exposed. Such a problem is hardly seen when the lower limit of mask thickness T1 is more than 0.1 μm.

The upper limit of mask thickness T1 is desired to be less than 10 μm. If the growth inhibiting film is too thick, the mask substrate is liable to break due to difference in thermal expansion coefficient between the growth inhibiting film and the nitride semiconductor underlayer. The proper mask thickness T1 depends on the thickness of the nitride semiconductor underlayer or the nitride semiconductor multilayered structure covering the mask substrate. Thus, it is necessary to adjust the covering film thickness of the nitride semiconductor underlayer as well as mask thickness T1 to form depressions above the growth inhibiting films.

(Space Width)

A space portion (corresponding to the above-described window portion) of the mask substrate unprovided with the growth inhibiting film is desired to have a space width SW of more than 2 μm and less than 30 μm. In the case of the space width being too narrow, at the initial growth stage of the nitride semiconductor underlayer, crystallinity of the crystal portion growing in a direction perpendicular to the main surface of the substrate is degraded, thereby adversely affecting the crystal portion growing in the lateral direction thereafter. Further, if space width SW is too wide, the underlayer region on which the laser device can be formed becomes small, in which case the number of laser chips obtained per wafer decreases unfavorably.

(Longitudinal Direction of Growth Inhibiting Film)

The longitudinal direction of the growth inhibiting stripe film formed on the nitride semiconductor substrate or the nitride semiconductor substrate layer laminated over the base substrate having a main surface of a {0001} C plane is most preferably parallel to a <1-100> direction of the nitride semiconductor crystal, and next preferably parallel to a <11-20> direction, similarly as in the case of the groove of the processed substrate. Even when the longitudinal direction of the growth inhibiting film made an angle within about ±5° to such a specific crystal direction in the {0001} C plane, it did not cause any substantial effect.

Figure 18A:
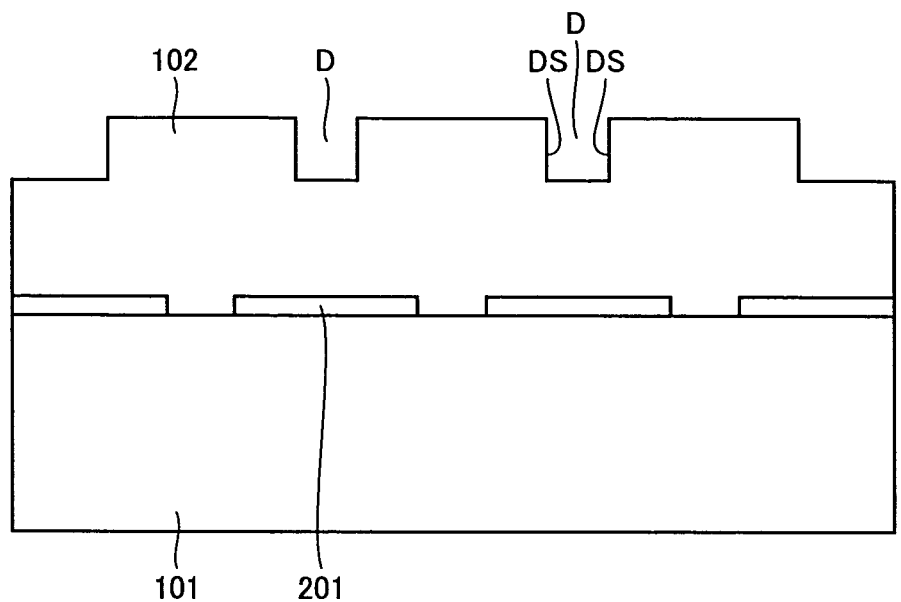
FIGS. 18A and 18B are schematic cross sectional views showing examples of the depressed substrate including the mask substrate usable in the present invention.

Formation of the growth inhibiting film in the <1-100> direction of the nitride semiconductor crystal is advantageous in that the depression is unlikely to be embedded and that the effects of suppressing crystal strain and occurrence of cracks are very high. When a nitride semiconductor underlayer is grown on the growth inhibiting film formed in this direction, the sidewall surface of the depression tends to become primarily a {11-20} plane. The {11-20} plane is perpendicular to the main surface of the substrate as shown in FIG. 18A, so that depression D is likely to have an approximately rectangular cross section. When the cross section of the depression is close to the rectangular shape, it is hard to supply a row material of the nitride semiconductor to the bottom of the depression, in which case growth inhibiting film 201 is not easily embedded in nitride semiconductor underlayer 102. Thus, depression D will not be embedded even if the mask substrate is covered with a relatively thick nitride semiconductor underlayer. Further, the crystal strain of the nitride semiconductor underlayer grown on the mask substrate is alleviated by such a deep depression, and occurrence of cracks is also suppressed effectively.

On the other hand, formation of the growth inhibiting stripe film in the <11-20> direction of the nitride semiconductor crystal is advantageous in that the shape of the depression becomes sharp and that fluctuation in position of the depression becomes small. In the case that a nitride semiconductor underlayer is grown on the growth inhibiting film formed in this direction, primarily a {1-101} plane is likely to be formed on the sidewall surface of the depression. The {1-101} plane is extremely flat, and the edge portion (see FIGS. 15 and 18B) is sharp and unlikely to meander. Thus, the depression in the <11-20> direction becomes straight, also unlikely to meander. Accordingly, it is possible to provide wide region BI for forming a light emitting device of a long operating lifetime as will be described later (leading to an increased number of light emitting devices obtained per wafer), and it is also possible to prevent decrease of the yield of the light emitting devices due to misalignment of the devices.

The growth inhibiting films described above all have the stripe shapes, which is preferable in the following point. A portion (beneath the ridge stripe) contributing to lasing of the nitride semiconductor laser device is in a stripe shape. Region BI preferable for forming the ridge stripe portion therein also has the stripe shape, as described below. Thus, it is easy to form the portion contributing to the lasing in region BI. Alternatively, the growth inhibiting films may be formed in a grid pattern, similarly as in the case of grooves G shown in FIGS. 5A–5C, for example.

(Nitride Semiconductor Underlayer Covering Mask Substrate)

The underlayer of nitride semiconductor film covering the mask substrate may be similar to the underlayer covering the processed substrate described above.

(Position for Forming Light Emitting Portion)

Referring to FIG. 19, the horizontal axis of a graph represents the distance from the mask center (c) of a depressed substrate to a ridge stripe edge (a) in the width direction, and the vertical axis represents the lasing lifetime. Here, the distance from mask center (c) to ridge stripe edge (a) (hereinafter, called "c-a distance") is expressed with the positive value on the right side of mask center (c) in the width direction, and expressed with the negative value on the left side thereof. In the nitride semiconductor laser device of case A measured in FIG. 19, a mask substrate including a GaN substrate was used, and the ridge stripe width, the mask width, the space width and the mask thickness were 2 μm, 18 μm, 15 μm and 0.2 μm, respectively.

As seen from case A of FIG. 19, the lasing lifetime of the nitride semiconductor laser device having a ridge stripe portion formed above growth inhibiting film 201 tends to become longer than that of the device having its ridge stripe portion formed above a region within space width SW. More detailed investigation has revealed that even in the region above growth inhibiting film 201, if the ridge stripe portion is formed in a region having the c-a distance of more than −5 μm and less than 3 μm, the lasing lifetime is decreased dramatically. Here, if the c-a distance of −5 μm is expressed in terms of a distance from mask center (c) to a ridge stripe edge (b) (hereinafter, called "c-b distance") taking account of the ridge stripe width RSW of 2 μm, the c-b distance becomes −3 μm. This means that the lasing lifetime is decreased remarkably when the ridge stripe portion of the nitride semiconductor laser device is formed such that at least a part thereof is included in a range of less than 3 μm on each side of mask center (c) in the width direction.

This can be understood as follows. In this case, depression edges (d), (e) exist 1 μm away from mask center (c) on the left side and on the right side, respectively. Thus, the lasing lifetime is decreased dramatically when the ridge stripe portion is formed such that at least a part thereof is included in a range of the depression or in a range of less than 2 μm from each depression edge to the outside of the depression.

Such a region where the lasing lifetime is decreased dramatically (in the range of less than 2 μm from each depression edge (d), (e) to the outside of the depression) is called a region BII. Thus, it is preferable to form the ridge stripe portion of the nitride semiconductor laser device such that its entire portion (a-b width) is included within the mask width MW range except region BII. Here, within the mask width MW range, a range of more than 2 μm away from respective depression edge (d), (e) to the outside of the depression is called a region BI. Region BI corresponds to a region where a nitride semiconductor laser device having a long lasing lifetime can be formed most preferably on the depressed substrate, even compared to the region BIII above the space portion.

Figure 17:
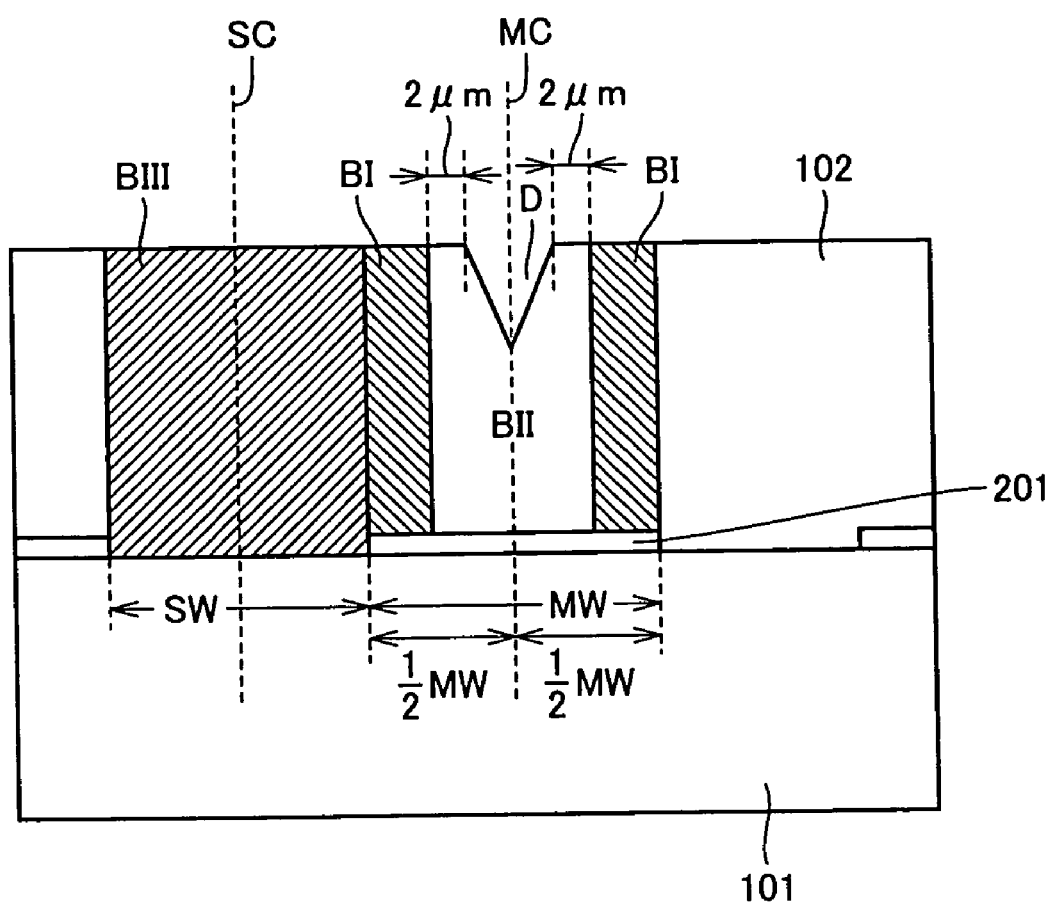
FIG. 17 is a schematic cross sectional view showing a preferable region for forming a light emitting device structure on a depressed substrate including a mask substrate in the present invention.

FIG. 17 shows above-described regions BI through BIII in a schematic cross sectional view of a depressed substrate. Specifically, it is preferable that the light emitting portion of the nitride semiconductor laser device is formed in region BI above the growth inhibiting film on the depressed substrate. The tendency similar to that of FIG. 19 was obtained even if the mask width, space width and ridge stripe width were varied. The tendency similar to that of FIG. 19 was also obtained even if the mask substrate was changed from the one including the GaN substrate to the one including a base substrate, though the lasing lifetime became shorter than in the case of including the GaN substrate. Thus, it is considered even in these cases that the region for forming the light emitting portion of the light emitting device to be formed on a depressed substrate shows the relation shown in FIG. 17.

Although the nitride semiconductor laser device of FIG. 19 had a ridge stripe structure, the relation similar to that of FIG. 19 was obtained even with a nitride semiconductor laser device having a current-blocking structure (in the case of the current-blocking structure, the ridge stripe width in FIG. 19 corresponds to the width through which electric current is constricted). As such, what is needed regarding the nitride semiconductor laser device is that region BI shown in FIG. 17 exists below the portion into which constricted current is introduced within the light emitting layer and which contributes to lasing.

However, in the ninth embodiment also similarly as in the case of the first embodiment, the lasing lifetime of the nitride semiconductor laser device having the current-blocking structure was shorter by about 20–30% than that of the laser device having the ridge stripe structure described above.

Further, decrease of the yield due to occurrence of cracks was considerable with respect to the nitride semiconductor laser device having the current-blocking structure compared to the device having the ridge stripe structure.

It is possible to obtain the effect of the present embodiment sufficiently in a light emitting diode (LED) device, similarly as in the case of the lasing device, as long as region BI shown in FIG. 17 exists below the portion into which current is introduced and which contributes to light emission.

[Tenth Embodiment]

Figure 18B:
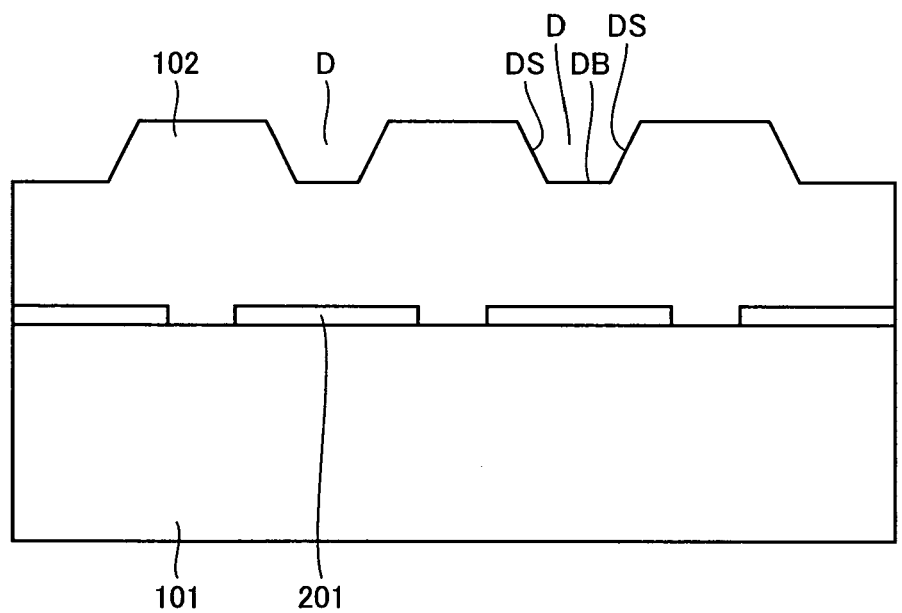

In a tenth embodiment, explanation is given for a method of forming a depressed substrate utilizing a mask substrate with reference to FIGS. 15, 18A and 18B. The matters not specifically explained in the present embodiment are similar to those of the ninth embodiment described above. FIG. 15 is a schematic cross sectional view of the depressed substrate, showing a nitride semiconductor substrate 101, a growth inhibiting film 201, a nitride semiconductor underlayer 102, and a depression D including side surface DS, a bottom surface DB and edges E. FIG. 18A shows the depressed substrate in the case that the depression has a cross section of a rectangular shape, and FIG. 18B shows the depressed substrate in the case that the depression has a cross section of an inverted trapezoid (which becomes a V shape when the crystal growth further proceeds).

The mask substrates of FIGS. 18A and 18B can be produced as follows. Firstly, on a (0001) main surface of the n type GaN substrate, the growth inhibiting film of $SiO_2$ is formed into a mask pattern of stripes by utilizing lithography. The growth inhibiting stripe films thus formed are arranged periodically in the <1-100> direction of the n type GaN substrate, and have a mask width, a mask thickness and a space width of 18 μm, 0.2 μm and 7 μm, respectively.

The mask substrate thus formed is subjected to organic cleaning thoroughly and transferred into the MOCVD system, to grow a nitride semiconductor underlayer of n type GaN film to a covering film thickness of 6 μm. Specifically, $NH_3$ as a source material for the group V element and TMGa or TEGa as a source material for the group III element are supplied over the mask substrate set in the MOCVD system, and $SiH_4$ (Si impurity concentration: $1 \times 10^{18}/cm^3$) is added to the source materials at a crystal growth temperature of 1050° C.

FIG. 18A shows the depressed substrate produced as described above in a schematic cross section. As seen from the figure, depression D was formed in a region above growth inhibiting film 201 on the above-described growth conditions, and the depression was formed such that the center position of the depression width was approximately with the mask center position of the growth inhibiting film. Further, when the growth inhibiting film was formed in the <1-100> direction of the GaN crystal, the depression had an approximately rectangular cross section.

Although the depression exists on the surface of the underlayer of nitride semiconductor film in the present embodiment, it is more preferable to grow the underlayer to make a gap between the growth inhibiting film and the depression, in which case the effect of alleviating the crystal lattice strain can be obtained also in the gap portion.

Further, the n type GaN layer (nitride semiconductor underlayer) grown on the mask substrate may be an $Al_xGa_y In_zN$ ($0 \leq x \leq 1$, $0 \leq y \leq 1$, $0 \leq z \leq 1$, x+y+z=1) layer, which may be doped with Si, O, Cl, S, C, Ge, Zn, Cd, Mg or Be.

Although the growth inhibiting stripe films have been formed in the <1-100> direction of the GaN crystal in the present embodiment, they may be formed in the <11-20> direction thereof. When the mask stripes were formed in the <11-20> direction of the GaN crystal, the depression had a cross section of approximately inverted trapezoid as shown in FIG. 18B. Incidentally, the inverted trapezoid cross section approaches a V shape as the bottom of the depression is gradually filled.

Although the GaN substrate having a main surface of a (0001) plane has been utilized in the present embodiment, another nitride semiconductor substrate and another plane orientation may be utilized. The mask width, space width and mask thickness of the mask substrate, and the covering film thickness of the nitride semiconductor underlayer described in the present embodiment may be changed to other numerical values if the numerical range conditions described in the ninth embodiment are satisfied. The same applies to the other embodiments.

[Eleventh Embodiment]

In an eleventh embodiment, a nitride semiconductor laser device is formed on the depressed substrate of the ninth or tenth embodiment.

(Crystal Growth)

Figure 20:
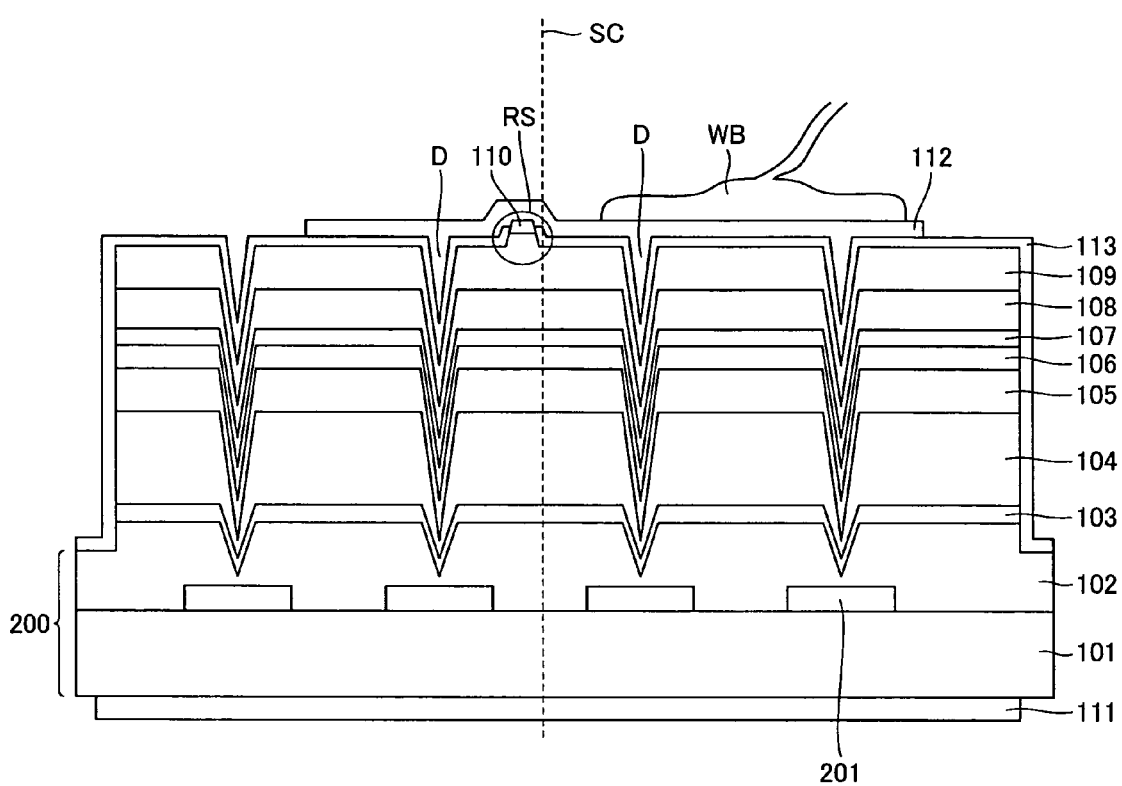
FIG. 20 is a schematic cross sectional view showing another example of the nitride semiconductor laser device formed on the depressed substrate according to the present invention.

FIG. 20 shows a nitride semiconductor laser device after chip division of a wafer including nitride semiconductor lasers grown over the depressed substrate. The nitride semiconductor laser device shown in FIG. 20 includes an n type GaN substrate 101, a $SiO_2$ growth inhibiting film 201, an n type $Al_{0.05}Ga_{0.95}N$ underlayer 102, a depressed substrate 200, an n type $In_{0.07}Ga_{0.93}N$ anti-crack layer 103, an n type $Al_{0.1}Ga_{0.9}N$ clad layer 104, an n type GaN light guide layer 105, a light emitting layer 106, a p type $Al_{0.2}Ga_{0.8}N$ carrier block layer 107, a p type GaN light guide layer 108, a p type $Al_{0.1}Ga_{0.9}N$ clad layer 109, a p type GaN contact layer 110, an n electrode 111, a p electrode 112, and a $SiO_2$ dielectric film 113.

In formation of such a nitride semiconductor laser device, firstly, depressed substrate 200 of the ninth or tenth embodiment is formed, though the longitudinal direction of growth inhibiting stripe film 201 is in the <1-100> direction of the GaN substrate in the eleventh embodiment.

Thereafter, nitride semiconductor multilayered structure 102–110 is deposited on depressed substrate 200 by MOCVD, similarly as in the case of the eighth embodiment using the processed substrate.

(Processing into Chips)

Processing into chips in the eleventh embodiment may be the same as in the case of the eighth embodiment.

(Packaging)

The semiconductor laser device obtained in the eleventh embodiment may be mounted to a package in a similar manner as in the case of the eighth embodiment.

In the present embodiment, the nitride semiconductor laser device is formed on the depressed substrate, so that crystal strain is alleviated and occurrence of cracks is suppressed. A lasing lifetime of about 18000 hours can be obtained, and the device yield can be improved by the crack suppressing effect.

[Twelfth Embodiment]

In a twelfth embodiment, a nitride semiconductor light emitting diode (LED) device is formed on the depressed substrate of any of the first through seventh, ninth and tenth embodiments. Here, the nitride semiconductor LED device layer is formed in a similar manner as in the conventional one.

In the nitride semiconductor LED device of the present embodiment, color mottling was decreased and luminous intensity was improved compared to the conventional case. In particular, the LED device having a light wavelength of short wavelength (less than 450 nm) or long wavelength (more than 600 nm), such as the nitride semiconductor LED device of white color or amber color, had luminous intensity of more than about twice, compared to the conventional case, by forming the LED device on the depressed substrate of any of the first through seventh, ninth and tenth embodiments.

[Thirteenth Embodiment]

A thirteenth embodiment is similar to the eighth, eleventh and twelfth embodiments except that a substitutional element of at least one of As, P and Sb is contained in the light emitting layer to substitute for some of N atoms. More specifically, the substitutional element of at least one of As, P and Sb is contained in substitution for some of N atoms in at least the well layer within the light emitting layer of the nitride semiconductor light emitting device. Here, when the total composition ratio of As, P and/or Sb contained in the well layer is expressed by x and the composition ratio of N is expressed by y, x is smaller than y and x/(x+y) is less than 0.3 (30%) and preferably less than 0.2 (20%). The lower limit of the total concentration of As, P and/or Sb is preferably greater than $1 \times 10^{18}/cm^3$.

This is because, when the composition ratio x of the substitutional element exceeds 20%, concentration separation begins to gradually occur in which the composition ratios of the substitutional element differ in regions within the well layer, and when the composition ratio x exceeds 30%, the concentration separation proceeds to crystal system separation into a hexagonal system and a cubic system, causing an increased possibility of degradation in crystallinity of the well layer. On the other hand, if the total concentration of the substitutional element is smaller than $1 \times 10^{18}/cm^3$, it is almost impossible to obtain the effect attainable by adding the substitutional element in the well layer.

The present embodiment has an effect that inclusion of the substitutional element of at least one of As, P and Sb in the well layer decreases the effective mass of electrons and holes in the well layer, thereby increasing mobility of the electrons and holes. In the case of a semiconductor laser device, the small effective mass means that carrier population inversion for lasing can be obtained by introducing a small amount of current. The increased mobility means that, even if electrons and holes in the light emitting layer are consumed by luminous recombination, new electrons and holes can rapidly be introduced by diffusion. That is, according to the present embodiment, it is possible to obtain a semiconductor laser having a small threshold current density and exhibiting excellent self-sustained pulsation characteristics (excellent noise characteristics) compared to an InGaN-based nitride semiconductor laser device of which well layer does not contain any of As, P or Sb.

On the other hand, when the present embodiment is applied to a nitride semiconductor LED device, inclusion of the substitutional element(s) of As, P and/or Sb in the well layer can decrease the In composition ratio within the well layer, compared to the case of the nitride semiconductor LED device having a conventional InGaN well layer. This means that it is possible to suppress degradation in crystallinity due to In concentration separation. Accordingly, the effect attainable by adding the substitutional element is combined with the effect concerning the nitride semiconductor LED device of the twelfth embodiment, so that the luminous intensity is further improved and the color mottling is further decreased. Particularly in the case of the nitride semiconductor LED device having a luminous wavelength of short wavelength (less than 450 nm) or long wavelength (more than 600 nm), such as a nitride semiconductor LED device of white or amber color including nitride semiconductor as its row material, the well layer can be formed with a small In composition ratio or even not containing In at all. Accordingly, the device suffers less color mottling and has stronger luminous intensity compared to a conventional InGaN-based nitride semiconductor LED device.

[Fourteenth Embodiment]

In a fourteenth embodiment, the nitride semiconductor laser device of the eighth, eleventh or twelfth embodiment is applied to an optical apparatus. The nitride semiconductor laser device of violet color (wavelength of 360–420 nm) of the eighth, eleventh or twelfth embodiment can preferably be utilized in various optical apparatuses, e.g., in an optical pickup apparatus, from the following viewpoint. Such a nitride semiconductor laser device can operate stably at high temperature (60° C.) and at high output (30 mW), and suffers less device defects and has a long lasing lifetime, so that it is optimally applicable to a highly reliable high-density recording/reproducing optical disk apparatus (shorter laser wavelength enables recording/reproduction of higher density).

Figure 21:
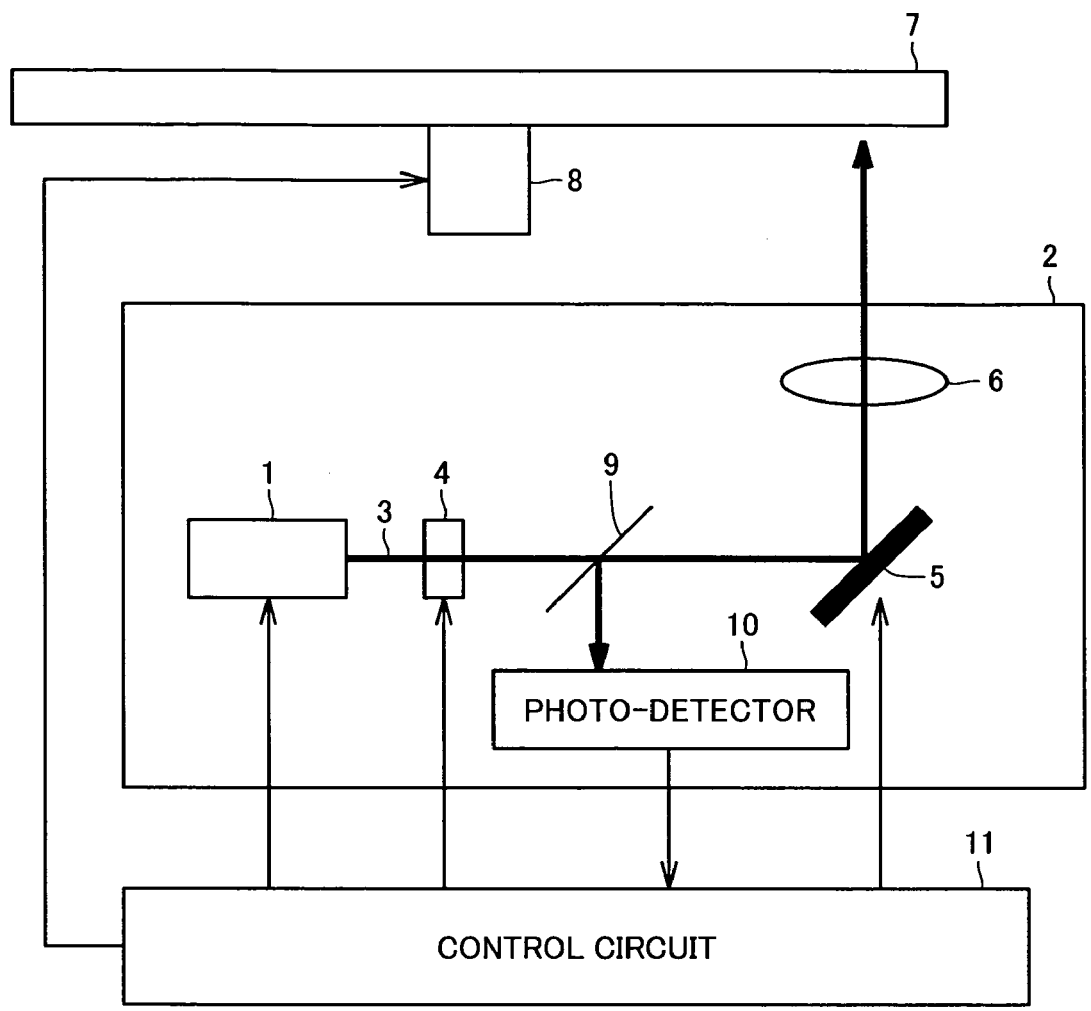
FIG. 21 is a schematic block diagram showing an example of an optical apparatus including an optical pickup utilizing the nitride semiconductor laser device of the present invention.

In FIG. 21, an optical disk apparatus such as a DVD apparatus including an optical pickup is shown in schematic block diagram as an example of an optical apparatus including the nitride semiconductor laser device of the eighth, eleventh or twelfth embodiment. In this optical information recording/reproducing apparatus, laser light 3 emitted from a light source 1 including the nitride semiconductor laser device is modulated by an optical modulator 4 in accordance with input information, and records the information on a disk 7 via a scan mirror 5 and a lens 6. Disk 7 is rotated by a motor 8. At the time of reproduction, reflected laser light optically modulated by bit arrangement on disk 7 is detected by a detector 10 via a beam splitter 9, and then a reproduced signal is obtained. The operations of the respective components are controlled by a control circuit 11. The output of laser device 1 is normally on the order of 30 mW during recording and on the order of 5 mW during reproduction.

The laser device of the present invention can be used not only for the above-described optical disk recording/reproducing apparatus, but also for a laser printer, a bar code reader, a projector including lasers of optical three primary colors (blue, green, red), and others.

[Fifteenth Embodiment]

In a fifteenth embodiment, the nitride semiconductor light emitting diode device of the twelfth or thirteenth embodiment is used for a semiconductor light emitting apparatus. Specifically, the nitride semiconductor light emitting diode device of the twelfth or thirteenth embodiment is usable as at least one of light emitting diodes for optical three primary colors (red, green and blue) in a display apparatus (semiconductor light emitting apparatus), for example. Use of such a nitride semiconductor light emitting diode device can realize a display apparatus which suffers less color mottling and exhibits strong luminous intensity.

Further, such nitride semiconductor light emitting diode devices capable of emitting optical three primary colors can also be used in a white light source apparatus. A nitride semiconductor light emitting diode device of the present invention having an emission wavelength in a range of ultraviolet to purple (about 360–420 nm) can also be used as a white light source apparatus by applying fluorescent coating.

Use of such a white light source makes it possible to realize a high-luminance backlight consuming less power and substitutable for a halogen light source conventionally used for a liquid crystal display. This white light source can be used as a backlight for a liquid crystal display in a man-machine interface of a portable notebook computer or a portable telephone, realizing a compact and high-definition liquid crystal display.

INDUSTRIAL APPLICABILITY

As described above, according to the present invention, it is possible to improve the nitride semiconductor light emitting device in its light emitting lifetime and luminous intensity. Further, according to the present invention, it is possible to prevent occurrence of cracks, electrode peeling and wire bond peeling in the nitride semiconductor light emitting device.

What is claimed is:

1. A nitride semiconductor light emitting device, comprising:
   a processed substrate (101a) including at least a groove (G) and at least a hill (H) formed on a surface of a nitride semiconductor;
   a nitride semiconductor underlayer (102) grown to cover said groove and said hill of said processed substrate; and
   a light emitting device structure having a light emitting layer (106) including a quantum well layer or a quantum well layer and a barrier layer in contact with the quantum well layer between an n type layer (103–105) and a p type layer (107–110) over said nitride semiconductor underlayer,
   wherein there exists at least a depression (D) not flatten above at least one of said groove and said hill even after growth of said nitride semiconductor underlayer of said light emitting device structure,
   and wherein in the case that a first depression is formed above said hill and no depression is formed above said groove, a light emitting portion of said light emitting device structure is formed above a region within the width of said groove and more than 1 µm away from the width center of said groove in the width direction or within the width of said hill and more than 2 µm away from a side edge of said first depression in the width direction; or
   in the case that a second depression is formed above said groove and no depression is formed above said hill, the light emitting portion of sold light emitting device structure is formed above a region within the width of said hill and more than 1 µm away from the center of said hill in the width direction or within the width of said groove and more than 2 µm away from a side edge of said second depression in the width direction; or
   in the case that the first depression is formed above said hill and the second depression is formed above said groove in said nitride semiconductor underlayer, the light emitting portion of said light emitting device structure is formed above a region within the width of said hill and more than 2 µm away from a side edge of said first and second depressions in the width direction or within the width of said groove and more than 2 µm away from a side edge of said first and second depressions in the width direction.

2. The nitride semiconductor light emitting device according to claim 1, wherein said processed substrate is entirely formed of a nitride semiconductor.

3. The nitride semiconductor light emitting device according to claim 1, wherein longitudinal directions of said groove and said hill are substantially parallel to a <1-100> direction or a <11-20> direction of a crystal of said nitride semiconductor underlayer.

4. The nitride semiconductor light emitting device according to claim 1, wherein there is no said depression above said groove or said hill in the case that said groove or said hill has a width in a range of 4–30 µm.

5. The nitride semiconductor light emitting device according to claim 1, wherein there is said depression above said groove or said hill in the case that said groove or said hill has a width in a range of 7–100 µm.

6. The nitride semiconductor light emitting device according to claim 1, wherein said groove has a depth in a range of 1–9 µm and there is no said depression above said groove.

7. The nitride semiconductor light emitting device according to claim 1, wherein said groove has a depth of more than 1 µm, there is a remaining thickness of more than 100 µm between the bottom of said groove and the back side of said substrate, and said depression exists above said groove.

8. The nitride semiconductor light emitting device according to claim 1, wherein said nitride semiconductor underlayer is formed of GaN, and said GaN contains at least one kind of impurity selected from a group consisting of Si, O, Cl, S, C, Ge, Zn, Cd, Mg and Be at a dose of more than $1\times10^{17}/cm^3$ and less than $5\times10^{18}/cm^3$.

9. The nitride semiconductor light emitting device according to claim 1, wherein said nitride semiconductor underlayer is formed of $Al_xGa_{1-x}N$ ($0.01 \leq x \leq 0.15$), and said $Al_xGa_{1-x}N$ contains at least one kind of impurity selected from a group consisting of Si, O, Cl, S, C, Ge, Zn, Cd, Mg and Be at a dose of more than $3\times10^{17}/cm^3$ and less than $5\times10^{18}/cm^3$.

10. The nitride semiconductor light emitting device according to claim 1, wherein said nitride semiconductor underlayer is formed of $In_xGa_{1-x}N$ ($0.01 \leq x \leq 0.15$), and said $In_xGa_{1-x}N$ contains at least one kind of impurity selected from a group consisting of Si, O, Cl, S, C, Ge, Zn, Cd, Mg and Be at a dose of more than $1\times10^{17}/cm^3$ and less than $4\times10^{18}/cm^3$.

11. The nitride semiconductor light emitting device according to claim 1, wherein an electrode is formed on an area including at least two said depressions.

12. The nitride semiconductor light emitting device according to claim 1, wherein a dielectric film is formed on an area including at least said first and second depressions.

13. The nitride semiconductor light emitting device according to claim 1, wherein at least one said depression is included in a bonding area between wire bond and said nitride semiconductor device.

14. The nitride semiconductor light emitting device according to claim 1, wherein said light emitting layer contains at least one kind of element of As, P and Sb.

15. A nitride semiconductor light emitting device, comprising:
   a mask substrate having a growth inhibiting stripe film (201) for suppressing growth of a nitride semiconductor thereon formed on a partial surface area of a nitride semiconductor substrate;
   a nitride semiconductor underlayer (102) grown on said mask substrate; and
   a light emitting device structure having a light emitting layer (106) including a quantum well layer or a quantum well layer and a barrier layer in contact with the quantum well layer between an n type layer (103–105) and a p type layer (107–110) over said nitride semiconductor underlayer, wherein a depression (D) not flattened is formed above said stripe growth inhibiting film even after growth of said light emitting device structure, and a light emitting portion of said light emitting device structure is formed above a region within the width of said growth inhibiting film and more than 2 µm away from a side edge of said depression in the width direction of said growth inhibiting film.

16. The nitride semiconductor light emitting device according to claim 15, wherein a longitudinal direction of said growth inhibiting stripe film is substantially parallel to a <1-100> direction or a <11-20> direction of a nitride semiconductor crystal included in said mask substrate.

17. The nitride semiconductor light emitting device according to claim 15, wherein there is a gap between said growth inhibiting film and said depression above said growth inhibiting film.

18. The nitride semiconductor light emitting device according to claim 15, wherein said growth inhibiting film has a width in a range of 7–100 µm.

19. The nitride semiconductor light emitting device according to claim 15, wherein said growth inhibiting film has a thickness in a range of 0.05–10 µm.

20. The nitride semiconductor light emitting device according to claim 15, wherein said growth inhibiting film includes at least one dielectric of $SiO_2$, $SiO$, $SiN_x$ and $SiON_x$, or at least one metal of W and Mo.

21. The nitride semiconductor light emitting device according to claim 15, wherein said nitride semiconductor underlayer contains at least one of Al and In.

22. The nitride semiconductor light emitting device according to claim 15, wherein said nitride semiconductor underlayer is formed of GaN, and said GaN contains at least one kind of impurity selected from a group consisting of Si, O, Cl, S, C, Ge, Zn, Cd, Mg and Be at a dose of more than $1\times10^{17}/cm^3$ and less than $5\times10^{18}/cm^3$.

23. The nitride semiconductor light emitting device according to claim 15, wherein said nitride semiconductor underlayer is formed of $Al_xGa_{1-x}N$ ($0.01 \leq x \leq 0.15$), and said $Al_xGa_{1-x}N$ contains at least one kind of impurity selected from a group consisting of Si, O, Cl, S, C, Ge, Zn, Cd, Mg and Be at a dose of more than $3\times10^{17}/cm^3$ and less than $5\times10^{18}/cm^3$.

24. The nitride semiconductor light emitting device according to claim 15, wherein said nitride semiconductor underlayer is formed of $In_xGa_{1-x}N$ ($0.01 \leq x \leq 0.15$), and said $In_xGa_{1-x}N$ contains at least one kind of impurity selected from a group consisting of Si, O, Cl, S, C, Ge, Zn, Cd, Mg and Be at a dose of more than $1\times10^{17}/cm^3$ and less than $4\times10^{18}/cm^3$.

25. The nitride semiconductor light emitting device according to claim 15, wherein an electrode is formed on an area including at least two said depressions.

26. The nitride semiconductor light emitting device according to claim 15, wherein a dielectric film is formed on an area including at least two said depressions.

27. The nitride semiconductor light emitting device according to claim 15, wherein at least one said depression is included in a bonding area between wire bond and said nitride semiconductor device.

28. The nitride semiconductor light emitting device according to claim 15, wherein said light emitting layer contains at least one kind of element of As, P and Sb.

29. The nitride semiconductor light emitting device according to claim 15, wherein said mask substrate is formed of a nitride semiconductor.

30. An optical apparatus including the nitride semiconductor light emitting device of claim 1.

31. An optical apparatus including the nitride semiconductor light emitting device of claim 15.

* * * * *